US007498601B2

(12) United States Patent
Hayakawa et al.

(10) Patent No.: US 7,498,601 B2
(45) Date of Patent: Mar. 3, 2009

(54) PHASE-CHANGE MEMORY DEVICE AND METHOD OF MANUFACTURING SAME

(75) Inventors: Tsutomu Hayakawa, Chuo-ku (JP); Shinpei Iijima, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 136 days.

(21) Appl. No.: 11/563,660

(22) Filed: Nov. 27, 2006

(65) Prior Publication Data
US 2007/0120106 A1 May 31, 2007

(30) Foreign Application Priority Data
Nov. 26, 2005 (JP) ............................. 2005-341291

(51) Int. Cl.
*H01L 29/04* (2006.01)
(52) U.S. Cl. .................. 257/3; 257/2; 257/4; 257/5; 257/E29.17; 257/E45.002
(58) Field of Classification Search .................. 257/3, 257/4, 2, 5, E29.17, E45.002
See application file for complete search history.

(56) References Cited
U.S. PATENT DOCUMENTS
7,037,762 B2 * 5/2006 Joo et al. .................. 438/128

7,038,261 B2 * 5/2006 Horii .......................... 257/295
2004/0037179 A1 * 2/2004 Lee ............................ 369/47.1
2005/0174861 A1 * 8/2005 Kim et al. ................... 365/200
2007/0120107 A1 * 5/2007 Hayakawa ...................... 257/4
2008/0042118 A1 * 2/2008 Hayakawa ...................... 257/4

FOREIGN PATENT DOCUMENTS
JP          2003-332529 A        11/2003

* cited by examiner

Primary Examiner—Andy Huynh
(74) Attorney, Agent, or Firm—Sughrue Mion, PLLC

(57) ABSTRACT

A phase-change memory device has a phase-change layer, a heater electrode having an end held in contact with the phase-change layer, a contact plug of different kinds of material having a first electrically conductive material plug made of a first electrically conductive material and held in contact with the other end of the heater electrode, and a second electrically conductive material plug made of a second electrically conductive material having a specific resistance smaller than the first electrically conductive material, the first electrically conductive material plug and the second electrically conductive material plug being stacked in one contact hole, the heater electrode and the second electrically conductive material plug being held in contact with each other in overlapping relation to each other, and an electrically conductive layer electrically connected to the second electrically conductive material plug.

16 Claims, 19 Drawing Sheets

Fig. 1

|   | IV | V | VI | VII |
|---|----|---|----|-----|
| 1 |    |   |    |     |
| 2 |    |   | O  |     |
| 3 | Si | P | S  | Cl  |
| 4 | Ge | As| Se | Br  |
| 5 | Sn | Sb| Te | I   |

RELATED ART

RELATED ART

PHASE-CHANGE MEMORY DEVICE AND METHOD OF MANUFACTURING SAME

This application is based upon and claims the benefit of priority from Japanese Patent Application No. 2005-341291 filed on Nov. 26, 2005, the content of which is incorporated by reference.

BACKGROUND OF THE INVENTION

1. Field of the Invention

The present invention relates to a phase-change memory device and a method of manufacturing a phase-change memory device.

2. Description of the Related Art

Phase-change memory devices employ in their memory cells a phase-change layer (a chalcogenide semiconductor thin film or the like) whose electrical resistance changes depending on its state. Chalcogenide semiconductors are amorphous semiconductors including chalcogen elements.

Figure 1:
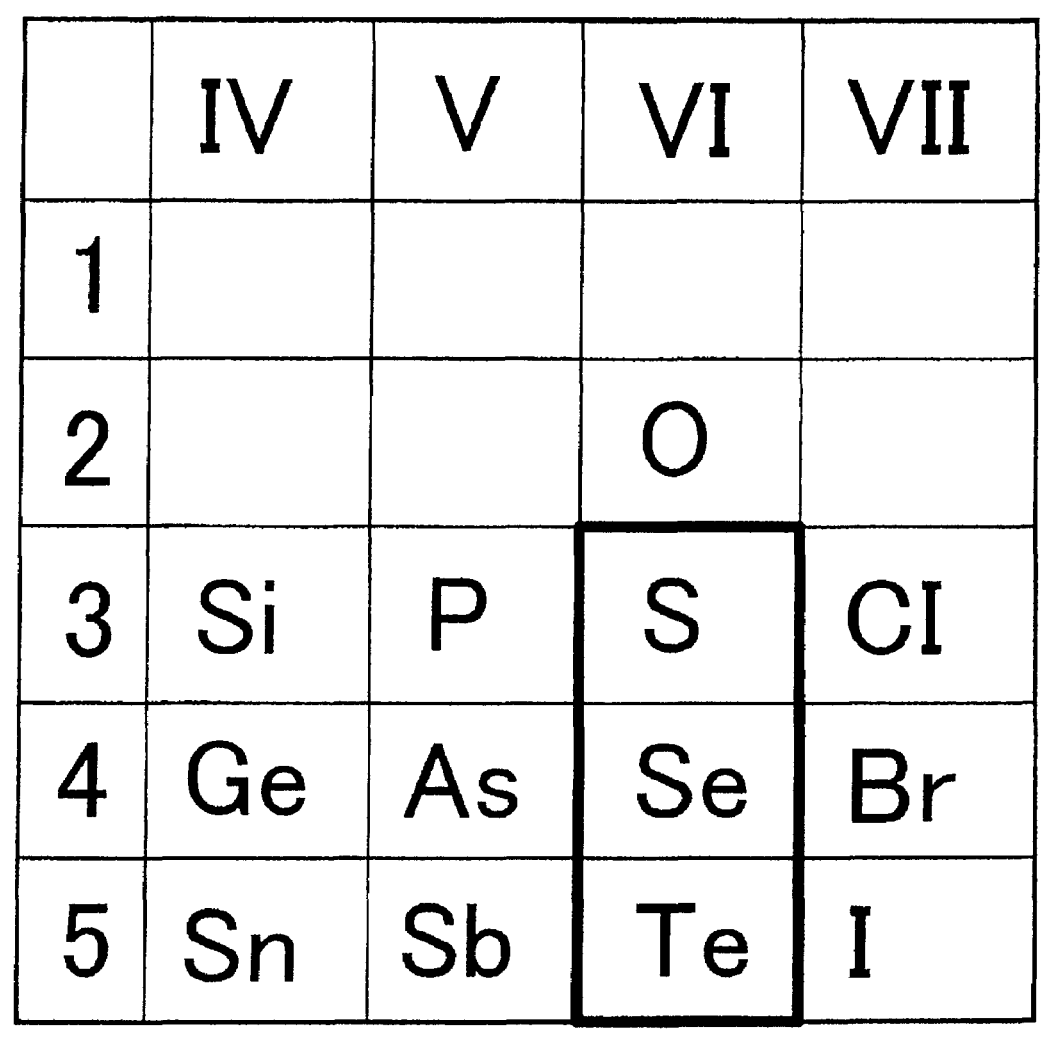

FIG. 1 of the accompanying drawings shows a portion of the periodic table which is illustrative of chalcogen elements. As shown in FIG. 1, chalcogen elements include S (Sulfur), Se (Selenium), and Te (Tellurium) in group 6 in the periodic table. Chalcogenide semiconductors are used in generally two fields, optical disks and electric memories. Chalcogenide semiconductors used in the field of electric memories include GeSbTe (hereinafter referred to as "GST") which is a compound of Ge (Germanium), Te (Tellurium), and Sb (Antimony), AsSbTe, SeSbTe, etc.

FIGS. 2A and 2B of the accompanying drawings are diagrams illustrative of the principles of a phase-change memory.

As shown in FIG. 2A, a chalcogenide semiconductor can take two stable states, i.e., amorphous state 10 and crystalline state 30. For switching from amorphous state 10 to crystalline state 30, the chalcogenide semiconductor needs to be supplied with heat in excess of energy barrier 20.

As shown in FIG. 2B, the amorphous state exhibits a higher electrical resistance corresponding to a digital value "1" and the crystalline state exhibits a lower electrical resistance corresponding to a digital value "0". This allows the chalcogenide semiconductor to store digital information. The amount of current flowing through the chalcogenide semiconductor or a voltage drop across the chalcogenide semiconductor is detected to determine whether the information stored in the chalcogenide semiconductor is "1" or "0".

Heat supplied to cause a phase change in the chalcogenide semiconductor is Joule heat. Specifically, pulses having different peak values and different pulse durations are applied to the chalcogenide semiconductor to generate Joule heat in the vicinity of contact surfaces of the electrodes and the chalcogenide semiconductor, and the Joule heat causes a phase change.

Specifically, after the chalcogenide semiconductor is supplied with heat at a temperature near its melting point, when the chalcogenide semiconductor is quickly cooled, it switches into the amorphous state. After the chalcogenide semiconductor is supplied with heat at a crystallizing temperature lower than the melting point for a long period of time, when the chalcogenide semiconductor is cooled, it switches into the crystalline state. For example, after the GST is supplied with heat at a temperature near the melting point (about 610° C.) for a short period of time (1 through 10 ns), when the GST is quickly cooled for about 1 ns, it switches into the amorphous state. After the GST is supplied with heat at a crystallizing temperature (about 450° C.) for a long period of time (30 through 50 ns), when the GST is cooled, it switches into the crystalline state.

As shown in FIG. 2B, switching from the amorphous state into the crystalline state is referred to as "setting" (crystallizing process), and a pulse applied to set the chalcogenide semiconductor is referred to as a "setting pulse". It is assumed that the minimum temperature (crystallizing temperature) required to crystallize the chalcogenide semiconductor is represented by Tc, and the minimum time (crystallizing time) required to crystallize the chalcogenide semiconductor is represented by tr. Conversely, switching from the crystalline state into the amorphous state is referred to as "resetting" (amorphizing process), and a pulse applied to reset the chalcogenide semiconductor is referred to as a "resetting pulse". Heat applied to the chalcogenide semiconductor for resetting the chalcogenide semiconductor is heat at a temperature near the melting point Tm. After the chalcogenide semiconductor is melted, it is rapidly quenched.

FIGS. 3A through 3D of the accompanying drawings are diagrams illustrating a basic structure of a phase-change memory device and the manner in which the phase-change memory device is set and reset.

As shown in FIG. 3A, the phase-change memory device is of a basic structure having chalcogenide semiconductor layer (phase-change layer) 46 sandwiched between upper and lower electrodes 48, 42. Lower electrode 42 is mounted on substrate 40 and isolated from upper electrode 48 by electric insulating film 44. Upper electrode 48 is connected to terminal P to which a setting pulse will be applied. Lower electrode 42 is connected to ground (reference electrode).

As shown in FIG. 3B, the phase-change memory device shown in FIG. 3A is equivalent to resistor R1. The resistance of resistor R1 varies depending on whether chalcogenide semiconductor layer 46 is in the amorphous state or the crystalline state. Setting pulse S1, i.e., a pulse having a peak value in excess of threshold value Vth, resetting pulse S2, i.e., a pulse having a peak value greater than setting pulse S1 and a shorter pulse duration than setting pulse S1, and reading pulse S3, i.e., a pulse having a peak value smaller than threshold value Vth and a longer pulse duration than setting pulse S1, are selectively applied to terminal P. Threshold value Vth represents a lower-limit voltage at which Joule heat required for crystallization can be generated.

FIG. 3C shows the relationship between setting pulse S1 and a temperature rise caused by the Joule heat that is generated when setting pulse S1 is applied to terminal P. In FIG. 3C, the upper curve represents the waveform of the voltage of setting pulse S1, and the lower curve 51 represents the manner in which the temperature increases due to the Joule heat.

The voltage value of setting pulse S1 is in excess of threshold value Vth, and the pulse duration of setting pulse S1 is represented by tcry. Pulse duration tcry is equal to or longer than crystallizing time tr, i.e., the minimum time required to crystallize the chalcogenide semiconductor. The temperature rise due to the Joule heat is considerably lower than melting point Tm and higher than minimum temperature Tc required for crystallization (crystallizing temperature).

Similarly, FIG. 3D shows the relationship between resetting pulse S2 and a temperature rise caused by the Joule heat that is generated when resetting pulse S2 is applied to terminal P. In FIG. 3D, the upper curve represents the waveform of the voltage of resetting pulse S2, and the lower curve 53 represents the manner in which the temperature increases due to the Joule heat.

As shown in FIG. 3D, resetting pulse S2 has a peak value much higher than threshold value Vth and a sufficiently small pulse duration. The temperature rise due to the Joule heat is in excess of melting point Tm of the chalcogenide semiconductor. The temperature falls from the peak value to crystallizing temperature Tc within sufficiently short time Tamo. Therefore, after the chalcogenide semiconductor is melted, it is quenched so that it returns to the amorphous state.

The phase-change memory device shown in FIGS. 3A through 3B has a circuit arrangement for supplying setting pulse S1 and resetting pulse S2 from terminal P. However, the phase-change memory device may have a circuit arrangement as shown in FIG. 4 of the accompanying drawings.

FIG. 4 is a circuit diagram of a circuit arrangement of the phase-change memory device.

In FIG. 4, resistor R1 is equivalent to the phase-change memory device and has an end connected to terminal P connected to power supply potential VDD. Resistor R1 has the other end connected to size-adjusted MOS transistors M1, M2, M3 having respective gates connected to setting pulse terminal P1, resetting pulse terminal P2, and reading pulse terminal P3, respectively.

Setting, resetting, and reading pulse signals are selectively applied to setting pulse terminal P1, resetting pulse terminal P2, and reading pulse terminal P3, respectively, to select which one of MOS transistors M1, M2, M3 is to be turned on, and to control the turn-on time of a selected one of MOS transistors M1, M2, M3. In this manner, the phase-change memory device operates in the setting, resetting, and reading modes.

FIG. 5 of the accompanying drawings is a circuit diagram showing the manner in which a phase-change memory device (phase-change memory IC) operates in a reading mode. Those parts shown in FIG. 5 which are identical to those shown in FIGS. 3A through 3D and 4 are denoted by identical reference characters.

In FIG. 5, a word line is represented by W, a ground line by G, a bit line (a pulse input line connected to terminal P for inputting setting pulse S1, resetting pulse S2, and reading pulse S3) by B, and a resistor equivalent to the phase-change memory device (comprising chalcogenide semiconductor layer 60) which serves as a memory cell by R1.

An NMOS transistor (switching device) for selecting a memory cell is represented by M4, a current-to-voltage converting resistor by R2, a sense amplifier by A1, a reference voltage source for sense amplifier A1 by 62, a current flowing through the memory cell in the reading mode by I1, and an output voltage of sense amplifier A1 (sensing output) by Vout.

In the setting mode (also in the resetting mode and the reading mode), word line W is activated to turn on NMOS transistor M4. Thereafter, one of pulses S1, S2, S3 is supplied from terminal P. In the reading mode, reading pulse S3 is supplied from terminal P.

The resistance of resistor R1 varies and hence the amount of current I1 flowing therethrough varies depending on whether chalcogenide semiconductor layer 60 of the memory cell is in the amorphous state or the crystalline state. By converting the amount of current I1 into a voltage and reading the voltage, it is possible to determine whether information stored in the memory cell is "1" or "0".

FIG. 6 of the accompanying drawings is a fragmentary cross-sectional view showing specific structural details of a memory cell provided by a phase-change memory device (phase-change memory IC).

In FIG. 6, p-type semiconductor substrate 70 has n-type source layer 71 and n-type drain layer 72 disposed therein, and gate electrode 74 connected to word line W is disposed on gate insulating film 73 that is disposed on p-type semiconductor substrate 70.

Interlayer insulating films 75, 79 are disposed on gate insulating film 73. An electrode connected to n-type source layer 71 comprises contact plug 76 extending through interlayer insulating film 75 and gate insulating film 73 and electrode 78 connected to contact plug 76 and comprising a first conductive layer disposed in interlayer insulating film 79. The electrode is connected to ground line G.

Contact plug 77 made of tungsten (W), for example, extends through interlayer insulating film 75 and is connected to n-type drain layer 72. Contact plug 80 (heater electrode made of TiN) serving as a heater electrode extends through interlayer insulating film 79 and is connected to contact plug 77.

Phase-change layer 82 comprising a chalcogenide semiconductor is disposed on interlayer insulating film 79 with adhering layer 81 in the form of a thin metal film being interposed therebetween. Adhering layer 81 is interposed to hold phase-change layer 82 and interlayer insulating film 79 closely together because phase-change layer 82 and interlayer insulating film 79 will not adhere closely to each other.

Upper electrode 83 comprising a second conductive layer is disposed on phase-change layer 82 and extends over its upper surface. Interlayer insulating film 84 is disposed on upper electrode 83. Contact plug 85 connected to upper electrode 83 extends through interlayer insulating film 84. Electrode 86 comprising a third conductive layer is disposed on interlayer insulating film 84 and connected to contact plug 85. Electrode 86 serves as pulse supply terminal P.

Phase-change layer 82 includes a region surrounded by thick dotted line X, where a phase change occurs. Electrode 80 made of titanium nitride (TiN) is embedded in interlayer insulating film 79. Electrode 80 constricts a current flowing through phase-change layer 82 to increase the current density for efficiently generating Joule heat in phase-change region X. Therefore, electrode 80 is called a heater electrode (heating electrode), and will hereinafter referred to as heater electrode 80.

The current density of the current flowing through phase-change layer 82 increases and the generated Joule heat increases as the area of contact between heater electrode 80 and phase-change layer 82 decreases. Consequently, the area of contact between heater electrode 80 and phase-change layer 82 is set to a sufficiently small area, e.g., an area determined by photolithographically designed minimum dimensions.

A phase-change memory device with the phase-change layer sandwiched between the upper and lower electrodes is disclosed in Japanese laid-open patent publication No. 2003-332529, for example. The publication also discloses that the lower electrode (heater electrode) has a pointed end to minimize the area of contact between the electrode and the phase-change layer in order to prevent the thermal efficiency from being lowered in the phase-change process of the phase-change memory device.

The inventor of the present invention has studied the phase-change memory device shown in FIG. 6 and found that it suffers various disadvantages as described below.

The phase-change memory device shown in FIG. 6 has a heat radiation route for transmitting heat generated in phase-change region X of phase-change layer 82 downwardly through heater electrode 80 to contact plug 77 and for radiating the heat from contact plug 77. The heat radiation route necessarily occurs because of the structure of the phase-change memory device.

It should be noted that contact plug 77 and heater electrode 80 are made of different materials, and the heat radiation capability of contact plug 77 is high due to the different materials.

Specifically, contact plug 77 is made of a material of low resistance, e.g., tungsten, for the purpose of reducing the electrical resistance of contact plug 77, and heater electrode 80 is made of a material of high resistance, e.g., titanium nitride, for the purpose of efficiently generating Joule heat. Since a metal material having a higher electrical conductivity (the reciprocal of electrical resistivity) has a higher thermal conductivity, contact plug 77 having a lower resistance, i.e., a higher electrical conductivity, has a higher thermal conductivity than heater electrode 80 having a higher resistance, i.e., a lower electrical conductivity. Therefore, contact plug 77 functions as a heat sink (heat radiating fin) having good heat radiating capability.

Inasmuch as a phase change of the chalcogenide semiconductor is caused by Joule heat generated when a current flows therethrough, it is not preferable for Joule heat to be radiated through the heater electrode and the contact plug and interconnections positioned beneath the heater electrode because the heat radiation would lead to a reduction in thermal efficiency.

Such a reduction in thermal efficiency does not pose a significant problem when a single phase-change memory device or a phase-change memory IC of low integration degree is made as a prototype. However, it could be a large problem when highly integrated phase-change memory ICs are actually mass-produced according to a microfabrication process.

Specifically, for manufacturing a phase-change memory device having high storage capacity, it is necessary to reduce the size of a memory cell, and it is important to reduce the resetting current, i.e., a current required to shift the phase-change layer from the crystalline state to the amorphous state. The structure wherein the contact electrode layer held in contact with the bottom surface of the phase-change layer functions as a heat sink (heat radiating fin) having good heat radiating capability is responsible for reducing the thermal efficiency and for preventing the amount of resetting current from being reduced.

If, on the other hand, the contact plug is made of a material of high resistance to reduce heat radiation from the contact plug, i.e., to increase the thermal efficiency, then the contact resistance between the contact plug and the semiconductor substrate increases, and the current flowing therethrough decreases. In this case, the size (width/length) of the transistor for selecting the memory cell needs to be increased, posing an obstacle to efforts to reduce an element size, i.e., to increase the storage capacity of the phase-change memory device.

It is thus difficult to design a phase-change memory device having suppressed heat radiation immediately below the heater electrode and reduced contact resistance between the heater electrode and the semiconductor substrate.

One solution is to bring contact plug 77 of tungsten, which is held in contact with the drain layer of an NMOS transistor, into contact with heater electrode 80 through a new contact plug made of the same material (TiN) as heater electrode 80, rather than into direct contact with heater electrode 80.

Specifically, for electrically connecting the semiconductor substrate and the heater electrode to each other, a contact plug of low resistance, made of tungsten, for example, having reduced contact resistance between itself and the semiconductor substrate is provided, and another contact plug made of the same material, e.g., titanium nitride, as the heater electrode is disposed on the contact plug having low resistance. The heater electrode made of titanium nitride, for example, is disposed on the contact plug having high resistance.

However, since the two contact plugs disposed in respective different layers are present between the semiconductor substrate and the heater electrode, the number of layers of the phase-change memory device increases, and the number of man-hours required to manufacture the phase-change memory device also increases. Furthermore, the two contact plugs may possibly be shifted in position with respect to each other. Accordingly, difficulty arises in mass-producing large-scale phase-change memory devices of this design.

The invention disclosed in Japanese laid-open patent publication No. 2003-332529 addresses heat radiation in the contact interface between the phase-change layer and the heater electrode, and does not refer to or suggest radiation of heat transmitted through the heater electrode from the lower electrode, as addressed by the present invention. The disclosure of the above publication does not present any solution to the radiation of heat referred to above. According to the disclosure of the above publication, the end of the heater electrode needs to be pointed at a sharp angle. The need to produce a heater electrode having a pointed end, however, tends to make a method of manufacturing a phase-change memory device complex.

SUMMARY OF THE INVENTION

It is an object of the present invention to make is possible to mass-produce large-scale phase-change memory devices having both good electrical characteristics and good thermal characteristics.

According to an aspect of the present invention, a phase-change memory device includes a phase-change layer, a heater electrode having an end held in contact with the phase-change layer, a contact plug of different kinds of material having a first electrically conductive material plug made of a first electrically conductive material and held in contact with the other end of the heater electrode, and a second electrically conductive material plug made of a second electrically conductive material having a specific resistance smaller than the first electrically conductive material, the first electrically conductive material plug and the second electrically conductive material plug being stacked in one contact hole, the heater electrode and the second electrically conductive material plug being held in contact with each other in overlapping relation to each other, and an electrically conductive layer electrically connected to the second electrically conductive material plug.

The contact plug of different kinds of material is used to reduce heat radiation and achieve good electric conductivity. The contact plug is an electrode used to electrically connect an electronic circuit component to another electronic circuit component, and is generally embedded in an electrical insulation film. The contact plug of different kinds of material refers to a composite contact plug made of at least two electrically conductive material layers (electrically conductive plugs) held in contact with each other through surfaces thereof. One conventional contact plug is of a structure which is formed by depositing a thin metal barrier, e.g., an auxiliary titanium layer to provide a good electrical connection with a lower silicon substrate, and thereafter embedding a metal having a small specific resistance, e.g., tungsten, in an insulating film. The conventional contact plug of this structure does not correspond to the "contact plug of different kinds of material" according to the present invention. The reason is that the portion of the conventional contact plug which positively functions as an electrode for interconnecting the electronic circuit components, i.e., the portion providing a current path, is made up of only the metal having a small specific resistance, e.g., tungsten, and the metal barrier is provided only for the purpose of manufacturing semiconductor devices better. The "contact plug of different kinds of material" according to the present invention includes at least two portions which positively function as electrodes for interconnecting the electronic circuit component, i.e., portions functioning as contact plugs, the two contact plugs being made of different electrically conductive materials and integrally combined into a composite contact plug. The electrically conductive materials of the "contact plug of different kinds of material" according to the present invention may also function as the metal barrier referred to above. The "contact plug of different kinds of material" according to the present invention is used to electrically interconnect a heater electrode and an electrically conductive layer which includes a diffused layer disposed in a semiconductor substrate, a metal layer and a silicon layer disposed on the diffused layer, and an electrically conductive layer serving as a portion of an electronic circuit. The portion of the "contact plug of different kinds of material" according to the present invention which contacts the heater electrode is in the form of the first electrically conductive material plug that is made of the first electrically conductive material which has a greater specific resistance (a smaller electrical conductivity and a smaller thermal conductivity) than the second electrically conductive material, thereby reducing the radiation of heat transferred through the heater electrode. The second electrically conductive material of the second electrically conductive material plug has a smaller specific resistance (a greater electrical conductivity and a greater thermal conductivity) than the first electrically conductive material. The second electrically conductive material plug is effective in sufficiently reducing the overall electrical resistance of the contact plug of different kinds of material. The electrically conductive layer is electrically connected to the second electrically conductive material plug. The plugs are stacked in one contact hole, and the first electrically conductive material plug having a lower surface held in contact with an upper surface of the second electrically conductive material plug, the first and second electrically conductive material plugs having side surfaces held out of contact with each other. The heater electrode and the second electrically conductive material plug overlap each other. Since the first electrically conductive material plug is having high resistance and suppresses heat radiation, thermal efficiency is improved when data is written in the phase-change memory device, i.e., when the phase-change memory device is reset. Since the second electrically conductive material plug having low resistance is present beneath the first electrically conductive material plug, the overall resistance of the contact plug is low. Therefore, even though the size (W/L) of the transistor as a memory cell selecting element is not increased, a required electric current is maintained and the phase-change memory device (phase-change memory IC) is reduced in size and increased in storage capacity. With the contact plug of different kinds of material according to the present invention, two plugs, i.e., the first and second electrically conductive material plugs, are stacked in one contact hole, not that first and second plugs belonging to different layers are connected to each other. Accordingly, the number of layers is not increased, and the fabrication process is not made complex. Since both the plugs are stacked one on the other, the contact plug of different kinds of material does not occupy a large area, resulting in a contribution to an increase in the degree of integration of the phase-change memory device. As the problem of heat radiation beneath the heater electrode is solved, materials of low specific resistances can be selected more freely as electrode and interconnect materials in the other portions, so that a greater choice of materials that can be used is available. In addition, inasmuch as both the plugs are stacked one on the other, use of the contact plug of different kinds of material does not increase the area occupied by the contact plug of different kinds of material.

In the phase-change memory device according to the present invention, the second electrically conductive material plug is greater in volume than the first electrically conductive material plug. The first electrically conductive material plug is provided primarily for reducing the radiation of heat transferred from the heater electrode. The electrical resistance of the first electrically conductive material plug tends to increase slightly. However, if the volume of the second electrically conductive material plug which is made of a good conductor is greater than the volume of the first electrically conductive material plug, then the electrical resistance of the contact plug of different kinds of material is governed by the second electrically conductive material plug. Therefore, the overall electrical resistance of the contact plug of different kinds of material can sufficiently be low, causing no circuit operation problems.

In the phase-change memory device according to the present invention, the first electrically conductive material of the first electrically conductive material plug includes a metal material which is a major constituent of the heater element, and the second electrically conductive material of the second electrically conductive material plug includes a metal material which is a major constituent of a ground potential electrode or an interconnect of the phase-change memory device.

The above paragraph indicates that the first electrically conductive material plug includes a metal material which is a major constituent of the heater element held in contact with the plug, i.e., the first electrically conductive material plug is made of the same metal material as the heater electrode, and the second electrically conductive material plug includes a metal material which is a major constituent of ground electrodes and ground interconnects which are required to have a low resistance, i.e., the second electrically conductive material plug is made of the same metal material as ground electrodes and ground interconnects.

In the phase-change memory device according to the present invention, the first electrically conductive material of the first electrically conductive material plug comprises a metal material which is the same as or similar to a metal material of the heater element, and the second electrically conductive material of the second electrically conductive material plug comprises a metal material which is a major constituent of a ground potential electrode or an interconnect of the phase-change memory device.

The above paragraph indicates that the first electrically conductive material plug is made of the same metal material as the heater element held in contact with the plug, i.e., the first electrically conductive material plug is made of the same metal material as the heater electrode, and the second electrically conductive material plug is made of the same material as ground electrodes and ground interconnects which are required to have a low resistance, i.e., the second electrically conductive material plug is made of the same material as ground electrodes and ground interconnects.

In the phase-change memory device according to the present invention, the first electrically conductive material of the first electrically conductive material plug comprises a metal which is any one of titanium (Ti), tantalum (Ta), molybdenum (Mo), niobium (Nb), zirconium (Zr) or tungsten (W), or a nitride of the metal, or a silicide of the metal.

The above materials are metal materials that can be used as a major constituent of the first electrically conductive material plug. These metal materials can be used as the material of the heater electrode. Either one of the metal materials has an electrical conductivity and a thermal conductivity lower than aluminum (Al) or copper (Cu) that is used in silicon-based LSI circuits. However, these metal materials include materials that can be used as the material of the second electrically conductive material plug.

In the phase-change memory device according to the present invention, the first electrically conductive material of the first electrically conductive material plug comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

The above metal materials are metal materials that can be used as the material of the second electrically conductive material plug. These metal materials can basically be used as the material of the heater electrode.

In the phase-change memory device according to the present invention, the second electrically conductive material of the second electrically conductive material plug comprises a metal which is either tungsten (W), aluminum (Al), molybdenum (Mo), or copper (Cu), or a silicide of the metal.

The above metal materials are metal materials that can be used as the material of the second electrically conductive material plug. These metal materials can basically be used as the material of ground electrodes and ground interconnects. However, these metal materials include materials that can be used as the material of the first electrically conductive material plug.

In the phase-change memory device according to the present invention, the specific resistance of the first electrically conductive material of the first electrically conductive material plug is at least 10 times the specific resistance of the second electrically conductive material of the second electrically conductive material plug.

The above paragraph indicates the difference between the specific resistances of the materials of the first and second electrically conductive material plugs, i.e., the first and second electrically conductive materials. The electrical conductivities and the thermal conductivities of the first and second electrically conductive materials should preferably, but not necessarily, be different from each other by about 10 times. It is not very difficult to achieve such a difference with respect to the electrical conductivity and the thermal conductivity if materials are selected appropriately.

In the phase-change memory device according to the present invention, the first electrically conductive material plug comprises a plug formed of a metal material including titanium nitride (TiN) embedded in an upper space in the contact hole defined in an interlayer insulating film, and the second electrically conductive material plug comprises a plug formed of a metal material including tungsten (W) embedded in a lower space in the contact hole.

The first electrically conductive plug including titanium nitride (TiN) and the second electrically conductive plug including tungsten (W) are embedded in vertically stacked relationship in the common contact hole, forming the contact plug of different kinds of material. Titanium nitride (TiN) and tungsten (W) are highly compatible with each other to provide stable properties with respect to good electrical conductivity and reduced heat radiation.

The phase-change memory device according to the present invention further has a switching element for selecting a memory cell, the switching element having a pole electrically connected to the second electrically conductive material plug.

The above paragraph indicates that one pole of a switching element, e.g., an insulated-gate field-effect transistor, a bipolar transistor, a PN junction diode, a Schottky barrier diode, or the like, for selecting a memory cell is electrically connected to the heater electrode through the different-material contact hole, thereby providing a memory cell.

According to another aspect of the present invention, there is also provided a phase-change memory device including a switching element for selecting a memory cell, the switching element being disposed in or on a semiconductor substrate, a contact plug of different kinds of material having a first electrically conductive material plug and a second electrically conductive material plug which has both an electrical conductivity and a thermal conductivity greater than the first electrically conductive material plug, the first electrically conductive material plug and the second electrically conductive material plug being stacked one on the other, a heater electrode connected to the first electrically conductive material plug, the heater electrode and the second electrically conductive material plug being held in overlapping relation to each other, a phase-change layer connected to the heater electrode, and an electrode layer connected to the phase-change layer.

The phase-change memory device (phase-change memory IC) which is of a basic overall structure as described above is produced by successively forming a switching element, a contact plug of different kinds of material, a heater electrode, a phase-change layer, and an electrode terminal according to the semiconductor fabrication process.

According to still another aspect of the present invention, there is further provided a method of manufacturing a contact plug of different kinds of material, comprising the steps of selectively patterning a portion of an interlayer insulating film disposed on a semiconductor substrate to form a contact hole therein, embedding the second electrically conductive material in the contact hole and etching back the second electrically conductive material until the second electrically conductive material has an upper surface lower than an upper surface of the contact hole, thereby forming the second electrically conductive material plug, and embedding the first electrically conductive material in the contact hole over the second electrically conductive material therein, thereby forming the first electrically conductive material plug.

A contact plug of different kinds of material can be formed by embedding a second electrically conductive material in a lower space in a contact hole and thereafter embedding a first electrically conductive material in an upper space in the contact hole, using the metal material embedding technology and the etching technology.

According to yet another aspect of the present invention, there is also provided a method of manufacturing a phase-change memory device, comprising the steps of forming a switching element for selecting a memory cell, in or on a semiconductor substrate, forming the contact plug of different kinds of material such that the second electrically conductive material plug is held in electrical contact with one pole of the switching element, with a method of manufacturing a contact plug of different kinds of material, forming the heater electrode such that the heater electrode has a lower surface held in contact with an upper surface of the first electrically conductive material plug, forming the phase-change layer such that the phase-change layer has a lower surface held in contact with an upper surface of the heater electrode, and forming an electrode layer connected to at least a portion of an upper surface of the phase-change layer.

The phase-change memory device (phase-change memory IC) is manufactured by successively forming a switching element, a contact plug of different kinds of material, a heater electrode, a phase-change layer, and an electrode terminal according to the semiconductor fabrication process. The contact plug of different kinds of material is manufactured by the method of generating a contact plug of different kinds of material referred to above. According to the above manufacturing method, it is possible to manufacture a large-scale phase-change memory device while satisfying contradictory requirements for reduced heat radiation and reduced electric resistance using the general fabrication technology, i.e., without special fabrication processes.

In the method of manufacturing a phase-change memory device, the step of forming the contact plug of different kinds of material includes the step of forming a ground potential plug for keeping another pole of the switching element at a ground potential, when the contact plug of different kinds of material is formed.

The contact plug of different kinds of material and the ground potential plug can simultaneously be produced by a common fabrication process. Therefore, the number of fabrication steps can be reduced.

In the above method of manufacturing a phase-change memory device, the switching element comprises an insulated-gate field-effect transistor, and when a gate electrode of the insulated-gate field-effect transistor is formed, an electrically insulating layer is formed on upper and side surfaces of an electrically conductive material layer of the gate electrode.

With the phase-change memory device according to the present invention, since the contact plug of different kinds of material is disposed close to an insulated-gate field-effect transistor (MOS transistor) for selecting a memory cell, if the phase-change memory device is highly integrated, then a short circuit may possibly occur between the contact plug of different kinds of material and the gate electrode of the MOS transistor. To avoid such a short circuit, the upper and side surfaces of the electrically conductive material layer (doped polysilicon layer or the like) of the gate electrode are covered with an insulating film. The side surface of the electrically conductive material layer of the gate electrode may be covered with a side wall in the form of an insulating film according to CVD, for example. When the gate electrode is formed, a nitride film may be deposited on the supper surface of the electrically conductive material layer and then patterned, thereby covering the supper surface of the electrically conductive material layer.

BRIEF DESCRIPTION OF THE DRAWINGS

FIG. 1 is a diagram showing a portion of the periodic table which is illustrative of chalcogen elements;

DESCRIPTION OF THE EXEMPLARY EMBODIMENTS

First Embodiment

In the description which follows, the term "contact plug" refers to an electrode used to electrically connect an electronic circuit element and another electronic circuit element to each other, and is generally formed by being embedded in an electric insulating film.

The term "contact plug of different kinds of material" refers to a composite contact plug made of at least two electrically conductive material layers (electrically conductive plugs) held in contact with each other through surfaces thereof.

One conventional contact plug is of a structure which is formed by depositing a thin metal barrier, e.g., an auxiliary titanium layer to provide a good electrical connection with a lower silicon substrate, and thereafter embedding a metal having a small specific resistance, e.g., tungsten, in an insulating film. The conventional contact plug of this structure does not correspond to the "contact plug of different kinds of material" according to the present invention. The reason is that the portion of the conventional contact plug which positively functions as an electrode for interconnecting the electronic circuit components, i.e., the portion providing a current path, is made up of only the metal having a small specific resistance, e.g., tungsten, and the metal barrier is provided only for the purpose of manufacturing semiconductor devices better.

The "contact plug of different kinds of material" according to the present invention includes at least two portions which positively function as electrodes for interconnecting the electronic circuit components, i.e., portions functioning as contact plugs, the two contact plugs being made of different electrically conductive materials and integrally combined into a composite contact plug.

The electrically conductive materials of the "contact plug of different kinds of material" according to the present invention may also function as the metal barrier referred to above.

The "contact plug of different kinds of material" according to the present invention is used to electrically interconnect a heater electrode and an electrically conductive layer, i.e., a diffused layer, a metal electrode, an interconnect, or another contact plug on the silicon substrate.

Specific details of a phase-change memory device according to the first embodiment will be described below.

Figure 7A:
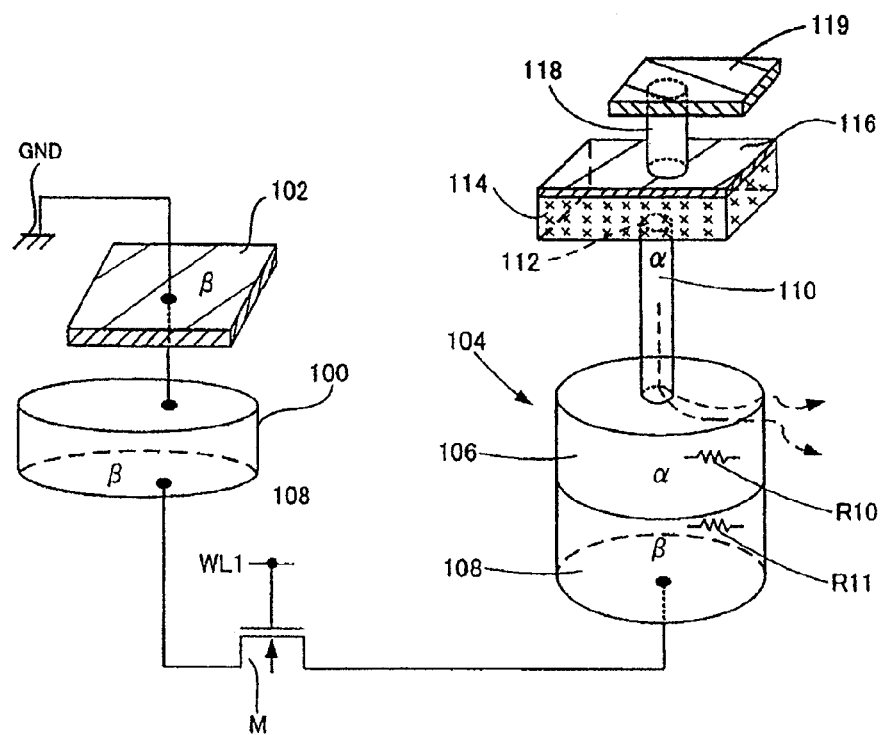
FIG. 7A is a view showing an essential structure of a phase-change memory device according to the present invention.
Figure 7B:
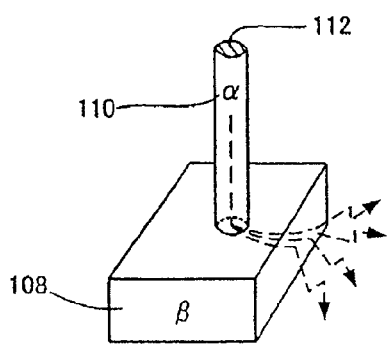
FIG. 7B is a view showing a conventional structure by which a heater electrode and a contact plug are connected to each other, as a comparative example.

FIGS. 7A and 7B show a characteristic structure of a phase-change memory device according to the present invention. FIG. 7A shows an essential structure of the phase-change memory device according to the present invention, and FIG. 7B shows a conventional structure by which a heater electrode and a contact plug are connected to each other, as a comparative example.

As shown in FIG. 7A, an NMOS transistor, i.e., an N-channel insulated-gate field effect transistor, M is a switching element for selecting a memory cell, and has a gate connected to word line WL1.

The source of NMOS transistor M is connected to ground potential metal plug 100 made of material β and also to ground potential (reference potential) GND through ground potential interconnect 102 which is a ground interconnect made of material β.

The drain of NMOS transistor M is electrically connected to second electrically conductive material plug 108 of contact plug of different kinds of material 104.

Contact plug of different kinds of material 104 comprises first electrically conductive material plug 106 made of first electrically conductive material α and second electrically conductive material plug 108 made of second electrically conductive material β. Plugs 106, 108 are stacked one on the other. Specifically, plugs 106, 108 are formed in a stacked configuration. First electrically conductive material plug 106 has a lower surface held in contact with an upper surface of second electrically conductive material plug 108. First and second electrically conductive material plugs 106, 108 have their side surfaces held out of contact with each other. Heater electrode 110 and second electrically conductive material plug 108 overlap each other. Specifically, electrically conductive material plug 108 is present directly below heater electrode 110.

First electrically conductive material plug 106 has specific resistance R10, and second electrically conductive material plug 108 has specific resistance R11. Specific resistances R11, R10 are related to each other such that R11<R10.

The specific resistance (ρ) is also called electric resistivity or volume resistivity, and the reciprocal (1/ρ) thereof is referred to as electrical conductivity which is also referred to as specific electrical conductivity. According to the present invention, the terms "specific resistance" and "electrical conductivity" will be used. A metal material which allows an electric current to flow easily therethrough also allows heat to be transferred easily therethrough. Therefore, material having a larger specific resistance has smaller electrical conductivity and a smaller thermal conductivity. First electrically conductive material α and second electrically conductive material β are related to each other such that α<β with respect to their electrical conductivity and thermal conductivity.

Heater electrode 110, which is a lower electrode made of material α, has a bottom surface held in contact with the upper surface of first electrically conductive material plug 106. Heater electrode 110 and first electrically conductive material plug 106 are made of the same material α, which can be said as a material that can be used as the heater electrode. Therefore, heater electrode 110 and first electrically conductive material plug 106 provide a structure which is more resistant to the dissipation of heat transferred downwardly through heater electrode 110.

With the conventional structure shown in FIG. 7B, heater electrode 110 is held in contact with second electrically conductive material plug 108, which is made of second electrically conductive material β that is a good electrical conductor and has a high thermal conductivity. Heater electrode 110 and second electrically conductive material plug 108 provide a structure which is less resistant to the dissipation of heat transferred downwardly through heater electrode 110.

Second electrically conductive material plug 108 is made of the same material as or a low-resistance material similar to the material β of ground potential metal plug 100 and ground potential interconnect 102. Therefore, the overall resistance of contact plug of different kinds of material 104 is of a low value.

In FIG. 7A, heater electrode 110 has an upper surface held in contact with the bottom surface of phase-change layer 114 made of GST. An area near contact surface 112 across which heater electrode 110 and phase-change layer 114 contact each other serves as a phase-change area where a phase change occurs.

Upper electrode 116 serving as an electrode layer is disposed on the upper surface of phase-change layer 114. Upper electrode 116 is connected to electrode terminal 119 through contact plug 118.

The phase-change memory device according to the present embodiment which is of the above structure has an improved thermal efficiency when data is written in the phase-change memory device, i.e., when the phase-change memory device is reset, and has a circuit of low resistance. These advantages are provided by contact plug of different kinds of material 104.

Specifically, since first electrically conductive material plug 106 is of high resistance and suppress heat radiation, the thermal efficiency of the phase-change memory device when data is written, i.e., when the phase-change memory device is reset, is improved. As second electrically conductive material plug 108 of low resistance is present beneath first electrically conductive material plug 106, the overall resistance of the contact plug is low. Therefore, even though the size (W/L) of the transistor (M) as a memory cell selecting element is not increased, a required electric current is maintained and the phase-change memory device (phase-change memory IC) is reduced in size and increased in storage capacity.

With contact plug of different kinds of material 104 according to the present invention, two plugs, i.e., the first and second electrically conductive material plugs, are stacked in one contact hole, not that first and second plugs belonging to different layers are connected to each other. Accordingly, the number of layers is not increased, and the fabrication process is not made complex.

Since plugs 106, 108 are stacked one on the other, contact plug of different kinds of material 104 does not occupy a large area, resulting in a contribution to an increase in the degree of integration of the phase-change memory device. As the problem of heat radiation beneath the heater electrode is solved, materials of low specific resistances can be selected more freely as electrode and interconnect materials in the other portions, so that a greater choice of materials that can be used is available.

In addition, inasmuch as both the plugs are stacked one on the other, use of the contact plug of different kinds of material does not increase the area occupied by the contact plug of different kinds of material.

Preferred aspects of contact plug of different kinds of material 104 and their features are listed as follows:

(1) Contact plug of different kinds of material 104 is made up of first electrically conductive material plug 106 and second electrically conductive material plug 108. First electrically conductive material α of first electrically conductive material plug 106 and second electrically conductive material β of second electrically conductive material plug 108 are related to each other such that α>β with respect to specific resistance and α<β with respect to electrical conductivity and thermal conductivity.

For example, if titanium (Ti: electrical conductivity of $2.34 \times 10^6 /\Omega \cdot m$ and thermal conductivity of 21.9 W/m·K) is used as first electrically conductive material α, then tungsten (W: electrical conductivity of $18.9 \times 10^6 /\Omega \cdot m$ and thermal conductivity of 17.4 W/m·K) whose electrical conductivity and thermal conductivity are greater than titanium is used as second electrically conductive material β.

In (2) and (3) below, specific materials that can be used as the first and second electrically conductive materials will be enumerated. Some metal materials, e.g., tungsten and molybdenum, are listed in both (2) and (3). Stated otherwise, tungsten and molybdenum may be used as both the first and second electrically conductive materials. The present invention does not reside in materials themselves, but combinations thereof. It is important according to the present invention that the relationship α>β be satisfied with respect to specific resistance and the relationship α<β be satisfied with respect to electrical conductivity and thermal conductivity.

(2) First electrically conductive material plug 106 is made of first electrically conductive material α, e.g., titanium nitride (TiN), that is selected from the standpoint of attaching more importance to thermal conductivity than to electrical conductivity and reducing thermal conductivity. First electrically conductive material α should preferably be the same material as heater electrode 110 or a material similar to heater electrode 110, i.e., a material whose major constituent is the same as that of heater electrode 110.

Specifically, first electrically conductive material α may be a material containing any one of the metals including titanium (Ti), tantalum (Ta), molybdenum (Mo), niobium (Nb), zirconium (Zr) or tungsten (W), or a nitride of an any one of the metals, or a silicide of any one of the metals. More specifically, first electrically conductive material α may be a material including titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi) or molybdenum silicide (MoSi).

(3) Second electrically conductive material plug 108 is made of second electrically conductive material β, e.g., tungsten (W), that is selected from the standpoint of attaching more importance to electrical conductivity than to thermal conductivity and reducing the circuit resistance.

Second electrically conductive material β should preferably be the same material as ground potential plug 100 and ground potential interconnect 102 which needs to be low in resistance, or a material similar to ground potential plug 100 and ground potential interconnect 102, i.e., a material whose major constituent is the same as that of ground potential plug 100 and ground potential interconnect 102. Specifically, second electrically conductive material β may be any one of metals including tungsten (W), aluminum (Al), molybdenum (Mo) or copper (Cu), or a silicide of any one of the metals.

(4) The electrical conductivity and the thermal conductivity of the major metal materials of first and second electrically conductive materials α, β should preferably, but not necessarily, be of approximate numerical values as follows:

The major metal material (first electrically conductive material α) of first electrically conductive material plug 106 should preferably have an electrical conductivity of the order of $1.0 \times 10^6 /\Omega \cdot m$ and a thermal conductivity of the order of 10.0 W/m·K, and the major metal material (second electrically conductive material β) of second electrically conductive material plug 108 should preferably have an electrical conductivity of the order of $10.0 \times 10^6 /\Omega \cdot m$ and a thermal conductivity of the order of 100.0 W/m·K. It is desirable that the electrical conductivity and the thermal conductivity of first electrically conductive material α be different from the electrical conductivity and the thermal conductivity of second electrically conductive material β by about 10 times, preferably more than 10 times.

The electrical conductivities and thermal conductivities of metal materials which can be candidates for the major constituents of first and second electrically conductive materials α, β are as follows: The electrical conductivity is indicated by C, and the thermal conductivity by P.

(Candidates for the major constituent of first electrically conductive material α)

Ti (titanium): $C=2.34 \times 10^6 /\Omega \cdot m$, $P=21.9$ W/m·K

Nb (niobium): $C=6.93 \times 10^6 /\Omega \cdot m$, $P=53.7$ W/m·K

Ta (tantalum): $C=7.61 \times 10^6 /\Omega \cdot m$, $P=57.5$ W/m·K

Zr (zirconium): $C=2.36 \times 10^6 /\Omega \cdot m$, $P=22.7$ W/m·K

TiN (titanium nitride): Since a nitride of a metal has properties taken over from the metal, TiN is considered to have properties similar to Ti. If a thin film of metal nitride is formed by CVD, then the characteristics of the thin film vary depending on the raw material gas, and the range in which the characteristics of the thin film vary also differs depending on the raw material gas. According to an experiment conducted by the inventor of the present invention, if TiCl4 was used as the raw material gas, then the specific resistance (the resistivity (the reciprocal of the conductivity)) of the thin film of TiN could vary in the range from $500 \times 10^{-8} /\Omega \cdot m$ to $900 \times 10^{-8} /\Omega \cdot m$. According to the MOCVD process, i.e., if $Ti[N(C_2H_5)_2]_4$ was used as the raw material gas, then the specific resistance of the thin film of TiN could vary in the range from $1000 \times 10^{-8} /\Omega \cdot m$ to $6000 \times 10^{-8} /\Omega \cdot m$. In either case, the sheet resistance of the thin film of TiN is considerably large.

(Candidates for the major constituent of second electrically conductive material β)

W (tungsten): $C=18.9\times10^6/\Omega\cdot m$, $P=174$ W/m·K

The inventor of the present invention produced a thin film of tungsten (W) according to the CVD process, and measured the specific resistance of the thin film. The measured specific resistance of the thin film was 10 μΩ·cm. It is understood that the specific resistance of the thin film of tungsten is less than ¹⁄₁₀ of the specific resistance of the thin film of TiN.

Al (aluminum): $C=37.7\times10^6/\Omega\cdot m$, $P=237$ W/m·K

Mo (molybdenum): $C=18.7\times10^6/\Omega\cdot m$, $P=138$ W/m·K

Cu (copper): $C=59.6\times10^6/\Omega\cdot m$, $P=401$ W/m·K

It can be seen from the numerical values of the electrical conductivities (and thin-film specific resistances) and the thermal conductivities of the metal materials that the metal material which can be the major constituent of first electrically conductive material α has an electrical conductivity of the order of $1.0\times10^6/\Omega\cdot m$ and a thermal conductivity of the order of 10.0 W/m·K, the metal material which can be the major constituent of second electrically conductive material β has an electrical conductivity of the order of $10.0\times10^6/\Omega\cdot m$ and a thermal conductivity of the order of 100.0 W/m·K, and the electrical conductivity and the thermal conductivity of first electrically conductive material α can be different from the electrical conductivity and the thermal conductivity of second electrically conductive material β by about 10 times. It is not very difficult to provide such a difference with respect to the electrical conductivity and the thermal conductivity if materials are selected appropriately.

(5) Examples of preferred electrically conductive materials are titanium nitride (TiN) and tungsten (W). Specifically, a thin film of titanium nitride (TiN) may be used as first electrically conductive material α and a thin film of tungsten (W) may be used as second electrically conductive material β. The specific resistances of a thin film of titanium nitride (TiN) and a thin film of tungsten (W) will be compared with each other below.

If a thin film of metal nitride is formed by CVD, then the specific resistance of the thin film varies depending on the raw material gas, and the range in which the specific resistance of the thin film varies also differs depending on the raw material gas. According to an experiment conducted by the inventor of the present invention, if TiC14 is used as the raw material gas, then the specific resistance of the thin film of TiN can vary in the range from $500\times10^{-8}/\Omega\cdot m$ to $900\times10^{-8}/\Omega\cdot m$. According to the MOCVD process, i.e., if $Ti[N(C_2H_5)_2]_4$ is used as the raw material gas, then the specific resistance of the thin film of TiN can vary in the range from $1000\times10^{-8}/\Omega\cdot m$ to $600\times10^{-8}/\Omega\cdot m$. In either case, the specific resistance of the thin film of TiN is considerably large.

The inventor of the present invention produced a thin film of tungsten (W) according to the CVD process, and measured the specific resistance of the thin film. The measured specific resistance of the thin film was 10 μΩ·cm. It is understood that the specific resistance of the thin film of tungsten is less than ¹⁄₁₀ of the specific resistance of the thin film of TiN.

(6) The volume of second electrically conductive material plug 108 should preferably be greater than the volume of first electrically conductive material plug 106. Specifically, first electrically conductive material plug 106 is provided primarily for reducing the radiation of heat transferred from heater electrode 110. The electrical resistance of first electrically conductive material plug 106 tends to increase slightly. However, if the volume of second electrically conductive material plug 108 which is made of a good conductor is greater than the volume of first electrically conductive material plug 106, then the electrical resistance of contact plug of different kinds of material 104 is governed by second electrically conductive material plug 108. Therefore, the overall electrical resistance of contact plug of different kinds of material 104 can be sufficiently low, causing no circuit operation problems.

(7) First electrically conductive material plug 106 and second electrically conductive material plug 108 are stacked one on the other, i.e., are present in vertically different positions. The lower surface of first electrically conductive material plug 106 and the upper surface of second electrically conductive material plug 108 are held in contact with each other. As a result, first electrically conductive material plug 106 and second electrically conductive material plug 108 are superposed on each other as viewed in plan. Second electrically conductive material plug 108 is present directly below first electrically conductive material plug 106. Since the plugs are stacked one on the other, the occupied area is not increased, resulting in a contribution to an increase in the degree of integration of the phase-change memory device.

Second Embodiment

In the present embodiment, a method of manufacturing a contact plug of different kinds of material will be described below.

FIGS. 8A through 8E are cross-sectional views of a device at each of major processing steps, illustrating a method of manufacturing a contact plug of different kinds of material according to the present invention.

Figure 8A:
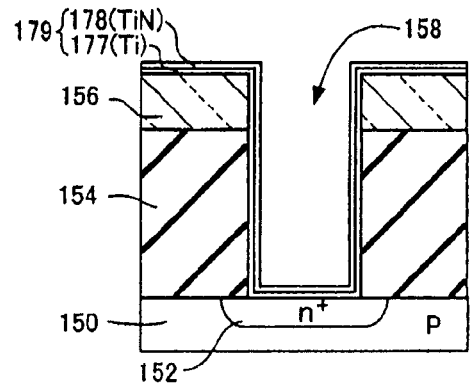
FIGS. 8A through 8E are cross-sectional views of a device at each of the major processing steps, illustrating a method of manufacturing a contact plug of different kinds of material according to the present invention.

As shown in FIG. 8A, after n-type layer (which constitutes the drain layer of an NMOS transistor) 152 is formed in p-type semiconductor substrate 150, interlayer insulating film 154 is deposited thereon. Then, silicon nitride film ($Si_3N_4$) 156 is deposited and patterned. Using patterned silicon nitride film ($Si_3N_4$) 156 as a mask, contact hole 158 is formed in interlayer insulating film 154 by anisotropic dry etching.

Then, titanium (Ti) film 177 serving as a metal barrier and titanium nitride (TiN) film 178 are successively deposited on the surface formed so far. Ti film 177 has a thickness of 15 nm, and TiN film 178 has a thickness of 50 nm, for example. The metal barrier functions to provide a good ohmic contact between the contact plug and base silicon substrate 200.

In FIGS. 8A through 8E, titanium (Ti) film 177 and titanium nitride (TiN) film 178 are jointly indicated by reference numeral 179. In the description which follows, these films may also be referred to as "metal barrier 179".

Figure 8B:
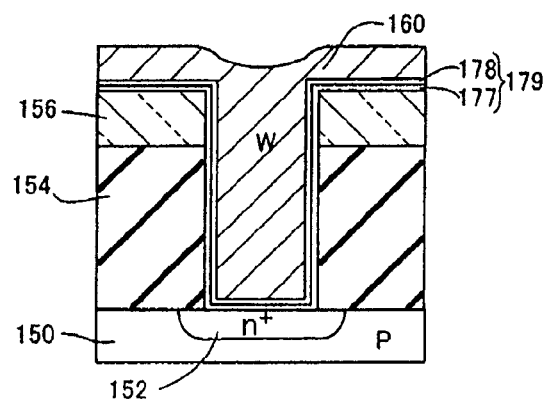

Then, as shown in FIG. 8B, tungsten (W) film 160 as a second electrically conductive material is deposited to a thickness of about 250 nm on semiconductor substrate 150 by CVD.

Figure 8C:
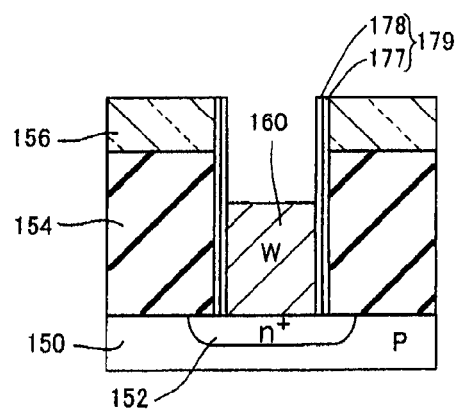

Then, as shown in FIG. 8C, tungsten (W) film 160 is etched back a thickness of about 300 nm by RIE (Reactive Ion Etching) using an $NH_3$ mixed gas until tungsten (W) film 160 has an upper surface lower than the upper surface of interlayer insulating film 154. In other words, a lower space in contact hole 158 is filled with tungsten (W), thereby forming second electrically conductive material plug 160 (denoted by 108 in FIG. 7A) which is made of the second electrically conductive material.

Figure 8D:
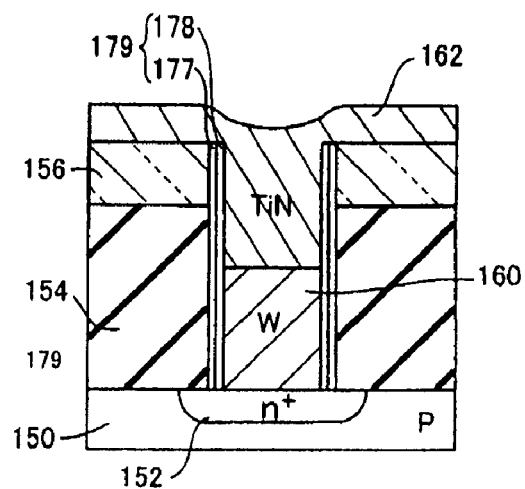

Then, as shown in FIG. 8D, titanium nitride (TiN) film 162 as a first electrically conductive material is deposited on semiconductor substrate 150.

Figure 8E:
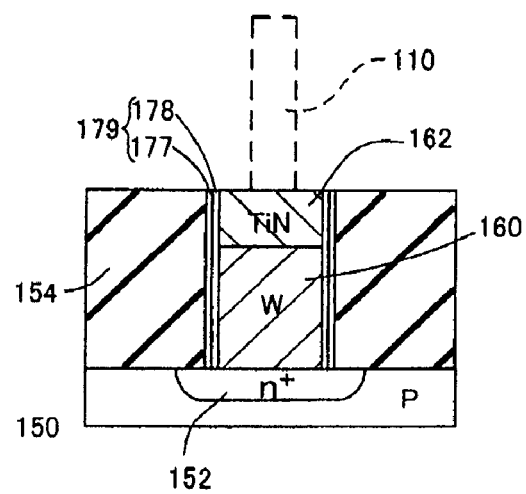

Then, as shown in FIG. 8E, the surface formed so far is planarized by CMP (Chemical Mechanical Polishing) down to the upper surface of interlayer insulating film 154, embedding titanium nitride film 162 in an upper space in contact hole 158 thereby to form first electrically conductive material plug 162 (denoted by 106 in FIG. 7A). First electrically conductive material plug 162 has a thickness of about 50 nm, for example.

Thereafter, heater electrode 110 (indicated by the dotted lines in FIG. 8E) is formed on first electrically conductive material plug 162 (denoted by 106 in FIG. 7A).

Since high-resistance first electrically conductive material plug 162 is present directly below heater electrode 110, it is capable of suppressing heat radiation. As low-resistance second electrically conductive material plug 160 is present beneath first electrically conductive material plug 162, the overall equivalent resistance of the contact plug, i.e., the contact resistance with respect to the semiconductor substrate, is not increased. Therefore, even though the size (W/L) of the transistor as a memory cell selecting element is not increased, a required electric current is maintained and the phase-change memory device (phase-change memory IC) is reduced in size and increased in storage capacity.

With the contact plug of different kinds of material according to the present invention, two plugs (first and second plugs) 162, 160 are stacked in one contact hole, not that first and second plugs belonging to different layers are connected to each other. Accordingly, the number of layers is not increased, and the fabrication process is not made complex.

Third Embodiment

In the present embodiment, a device structure which is suitable for a highly integrated phase-change memory will be described below.

Figure 9:
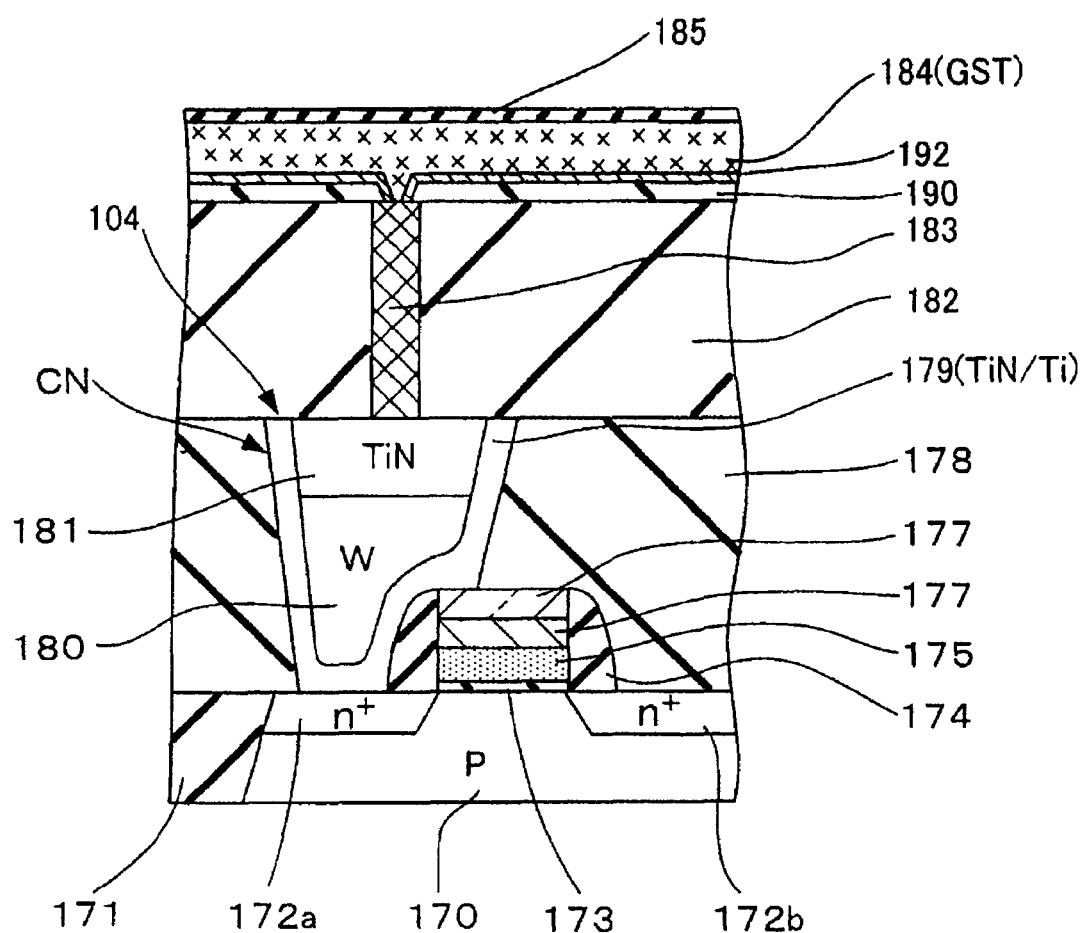
FIG. 9 is a fragmentary cross-sectional view illustrative of a device structure which is suitable for a highly integrated phase-change memory.

FIG. 9 is a fragmentary cross-sectional view illustrative of a device structure which is suitable for a highly integrated phase-change memory.

As shown in FIG. 9, shallow trench isolation (STI) 171 is disposed in p-type semiconductor substrate 170, and n-type diffused layers 172a, 172b as components of an NMOS transistor are disposed in p-type semiconductor substrate 170.

Gate insulating film 173 is disposed on p-type semiconductor substrate 170, and doped polysilicon layer 175 and tungsten silicide layer 176 as components of a gate electrode are successively disposed on gate insulating film 173.

Silicon nitride film 177 is disposed on tungsten silicide layer 176. Side walls 174 are disposed on side surfaces of the gate electrode. Silicon nitride film 177 and side walls 174 are provided to prevent a short circuit between the contact plug of different kinds of material and the gate electrode.

Interlayer insulating film 178 has contact hole CN defined therein. TiN/Ti film 179, which comprises a thin base titanium (Ti) film and a titanium nitride (TiN) film deposited thereon, is deposited as a metal barrier on an inner surface of contact hole CN.

A lower space in contact hole CN is filled with tungsten (W), and an upper space in contact hole CN is filled with titanium nitride (TiN) in contact with the upper surface of the tungsten layer. The tungsten layer and the titanium nitride layer which are thus deposited in contact hole CN jointly make up contact plug of different kinds of material 104.

Another interlayer insulating film 182 is deposited on interlayer insulating film 178. Contact plug 183 of titanium nitride (TiN) functioning as a heater electrode is disposed in interlayer insulating film 182.

Insulating film 190 is disposed on interlayer insulating film 182. Insulating film 190 is patterned to exposed an upper surface of heater electrode 183. Thin Ti film 192 as a contact layer is deposited on the surface formed so far, and GST film 184 as a phase-change layer is deposited on thin Ti film 192. Upper electrode 185 is disposed on the upper surface of GST film 184.

A method of manufacturing the device structure shown in FIG. 9 will be described in an embodiment illustrated below.

Fourth Embodiment

In the present embodiment, the circuit arrangement of a phase-change memory device (phase-change memory IC), a layout of memory cells, a specific cross-sectional structure of a memory cell assembly, and a method of manufacturing the same will be described below.

Figure 10:
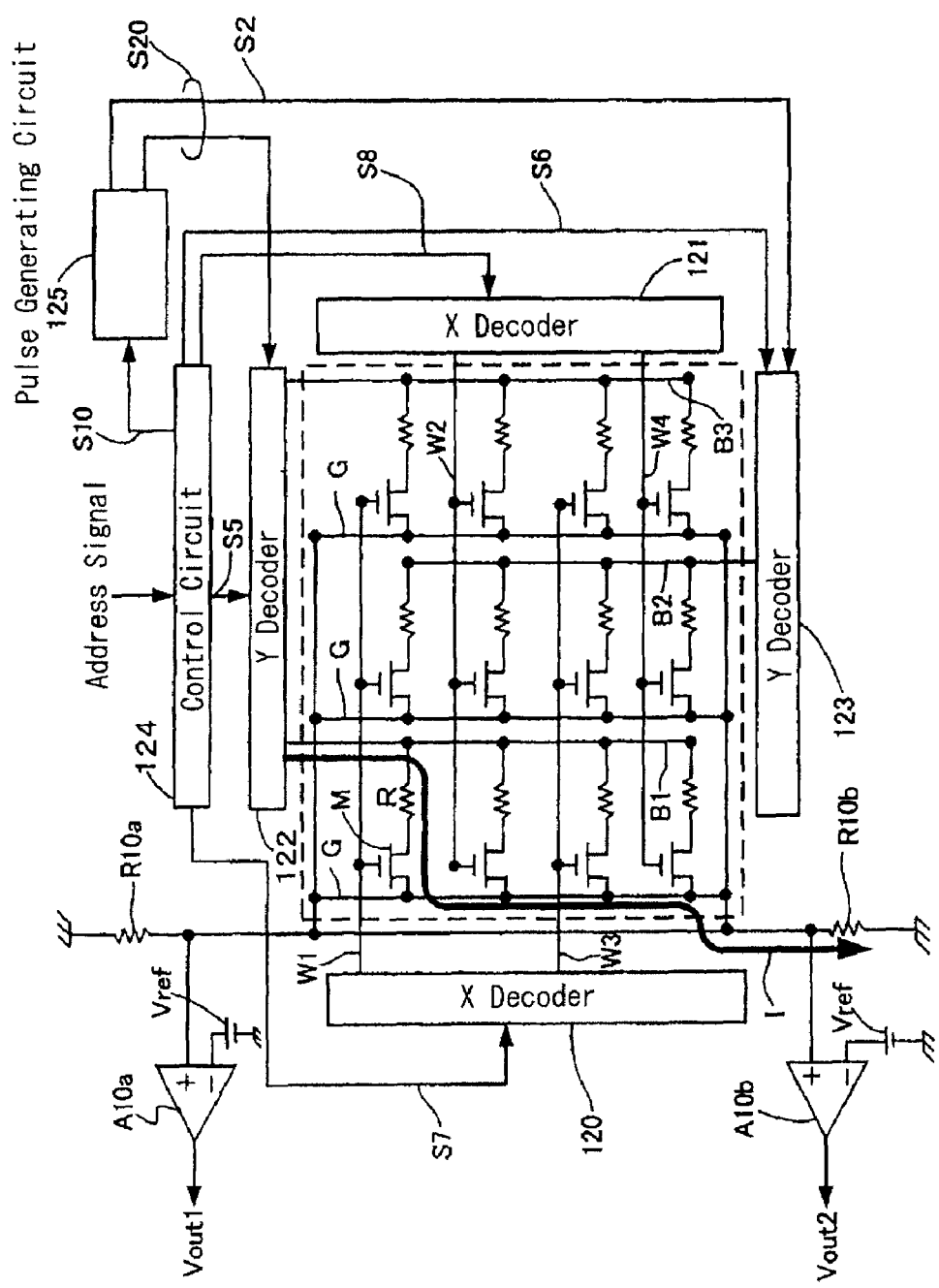
FIG. 10 is a circuit diagram showing an overall circuit arrangement of a phase-change memory device (phase-change memory IC) according to the present invention.

FIG. 10 is a circuit diagram showing an overall circuit arrangement of a phase-change memory device (phase-change memory IC) according to the present invention.

As shown in FIG. 10, a phase-change memory IC has a memory cell assembly disposed in a central area thereof. The memory cell assembly has a matrix of memory cells each comprising MOS transistor M for selecting element and a phase-change memory device (represented as equivalent resistor R) according to the present invention.

The phase-change memory IC also has ground lines (ground potential interconnects) G, word lines W1 through W4, and bit lines B1 through B3.

X decoders 120, 121 and Y decoders 122, 123 jointly make up an addressing circuit. X decoders 120, 121 energize word lines W1 through W4, and Y decoders 122,123 energize bit lines B1 through B3.

Control circuit 124 generally controls operation of the phase-change memory IC. Control circuit 124 supplies control signals S5 through S8 respectively to X decoders 120, 121 and Y decoders 122, 123 in order to individually control the operation of X decoders 120, 121 and Y decoders 122, 123.

Pulse generating circuit 125 generates various pulse signals (setting, resetting, and reading pulse signals) S20 based on control signal S10 from control circuit 124, and supplies generated pulse signals S20 to Y decoders 122, 123.

The phase-change memory IC also has operational amplifiers A10a, A10b as sense amplifiers, and current-to-voltage converting resistors R10a, R10b for converting current I (indicated by the thick solid line in FIG. 10) into a voltage. Reference voltage Vref is applied to operational amplifiers A10a, A10b, which output respective detected signals Vout1, Vout2 of the phase-change memory IC.

Figure 11:
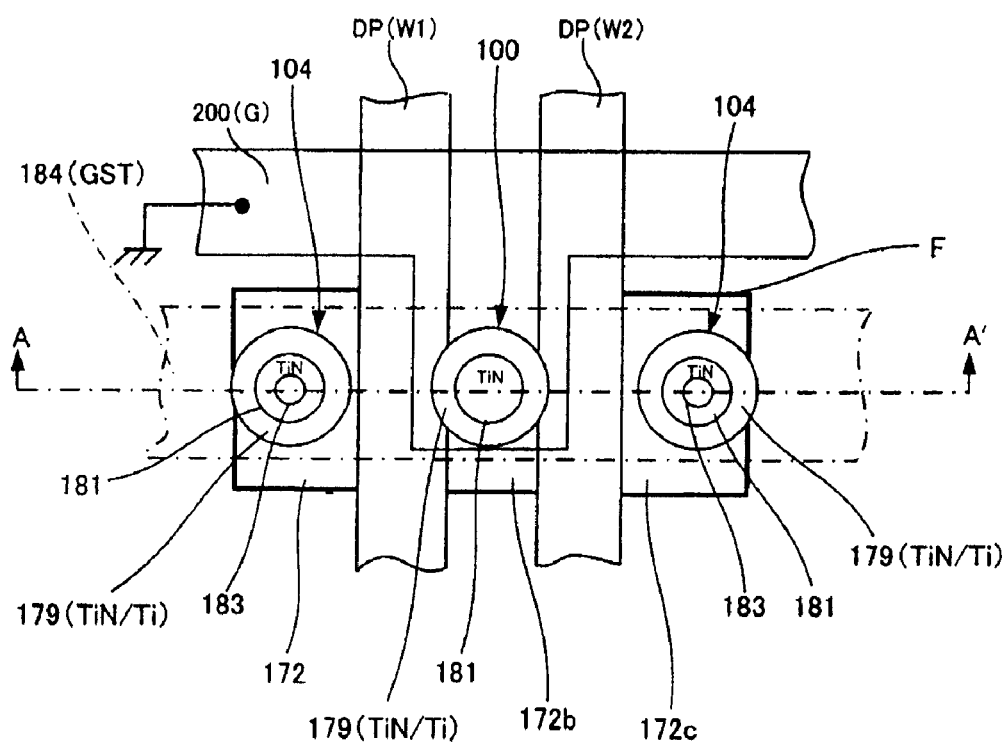
FIG. 11 is a plan view showing by way of example another layout of elements and interconnects in a memory cell area of the phase-change memory device (phase-change memory IC) shown in FIG. 10.

FIG. 11 is a plan view showing by way of example another layout of elements and interconnects in a memory cell area of the phase-change memory device (phase-change memory IC) shown in FIG. 10. Those parts in FIG. 11 which are identical to those shown in FIG. 9 are denoted by identical reference characters.

In FIG. 11, region F surrounded by the thick solid line is a field region (device forming region) surrounded by the shallow trench isolation (STI). Two vertical interconnects DP extending through the memory cell area comprise respective doped silicon layers serving as respective word lines W1, W2 and doubling as the gate electrodes of MOS transistors.

Each of horizontally spaced contact plug of different kinds of materials 104 comprises metal barrier 179 made of TiN/Ti, titanium nitride (TiN) layer 181 serving as a first contact plug, and tungsten (W) layer 180 (not shown in FIG. 11, see FIG. 9) serving as a second contact plug.

Figure 14:
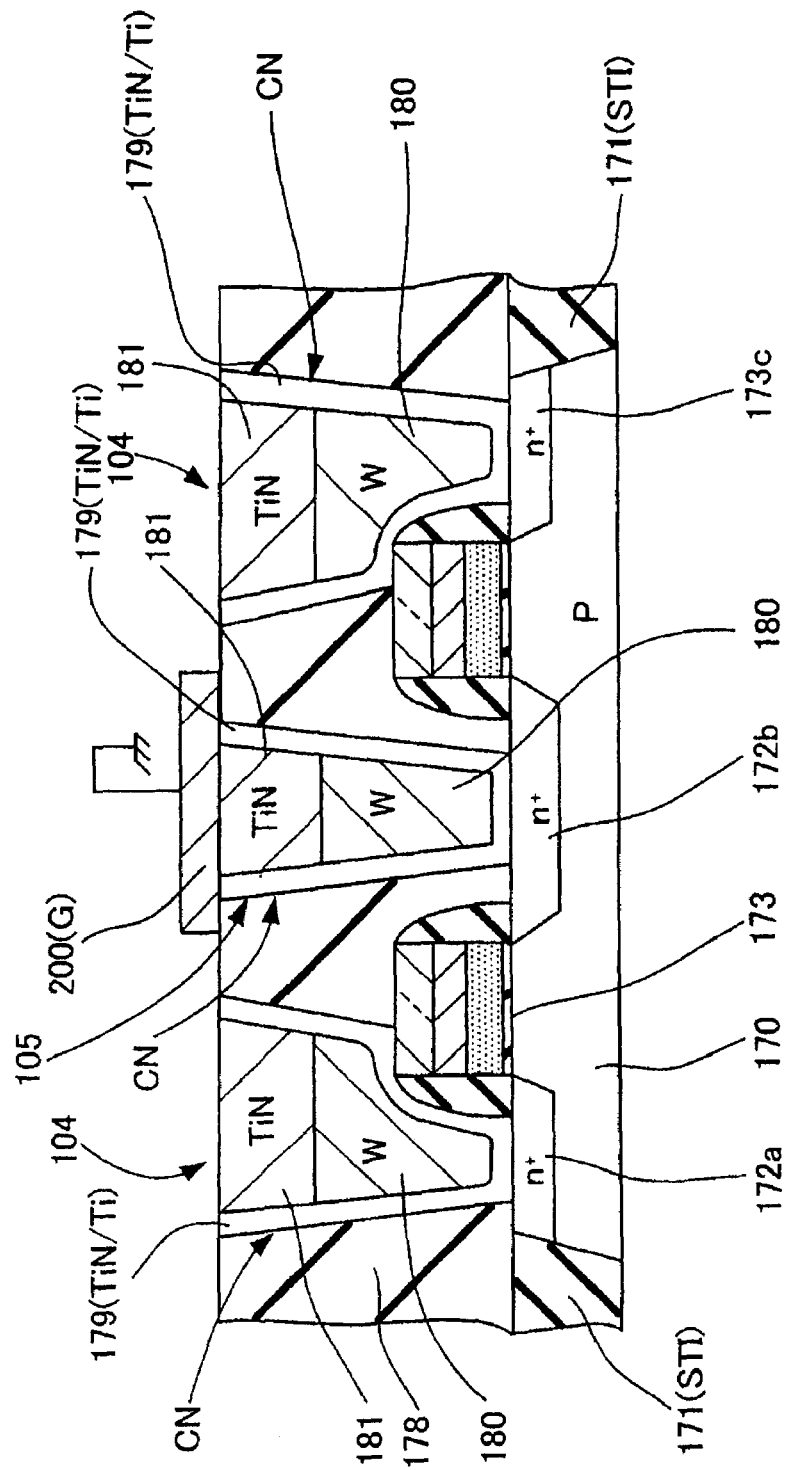
FIG. 14 is a cross-sectional view taken along line A-A of FIG. 11, showing a structure produced in a third manufacturing step.

Similarly, central ground potential plug 100 comprises metal barrier 179 made of TiN/Ti, titanium nitride (TiN) layer 181, and tungsten (W) layer 180 (not shown in FIG. 11, see FIG. 14). Central ground potential plug 100 is manufactured in the same step as contact plug of different kinds of materials 104.

In FIG. 11, the reference numeral 200 denotes ground interconnect G. GST film 184, which is should as being surrounded by the dot-and-dash lines in FIG. 11, serving as a phase-change layer extends horizontally in FIG. 11. The reference numeral 183 denotes heater electrodes.

A manufacturing method will be described below.

Figure 12:
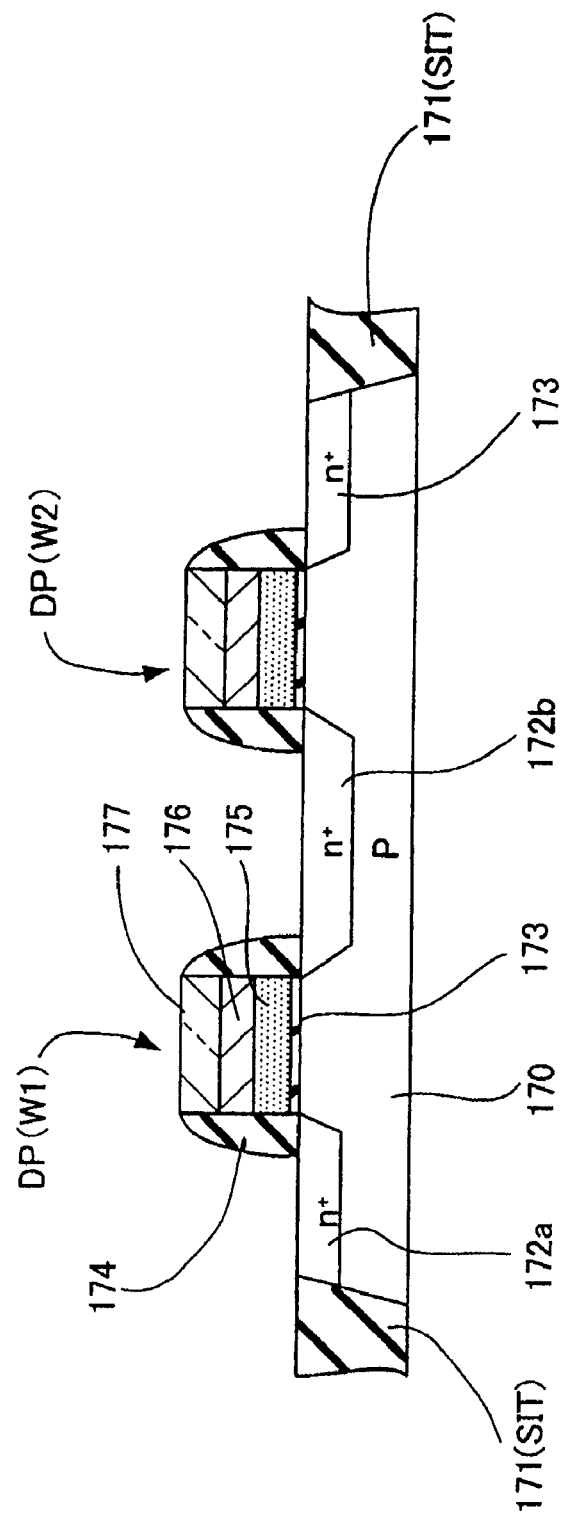
FIG. 12 is a cross-sectional view taken along line A-A of FIG. 11, showing a structure produced in a first manufacturing step.

(First Step: FIG. 12)

FIG. 12 is a cross-sectional view taken along line A-A of FIG. 11, showing a structure produced in a first manufacturing step.

As shown in FIG. 12, after shallow trench isolations (STIs) 171 as element separating regions are formed in p-type silicon substrate 170, gate oxide film 173 is deposited.

Then, doped silicon layer 175 is deposited to a thickness of 100 nm, tungsten silicide layer 176 is deposited to a thickness of 100 nm, and silicon nitride film 177 is deposited to a thickness of 100 nm.

Thereafter, a photoresist, not shown, is deposited and processed into an etching mask by photolithography.

Then, silicon nitride film 177 is etched by anisotropic etching such as RIE (Reactive Ion Etching), after which the etching mask is removed.

Then, using etched silicon nitride film 177 as a mask, tungsten silicide layer 176 and doped silicon layer 175 are successively etched to produce gate electrodes.

Using the gate electrodes as a mask, phosphorus (p) ions are introduced into p-type silicon substrate 170 to from n-type diffused layers 172a, 172b.

Then, a silicon nitride film is deposited to a thickness of 50 nm and then etched back by RIE, producing gate side walls 174.

Figure 5:
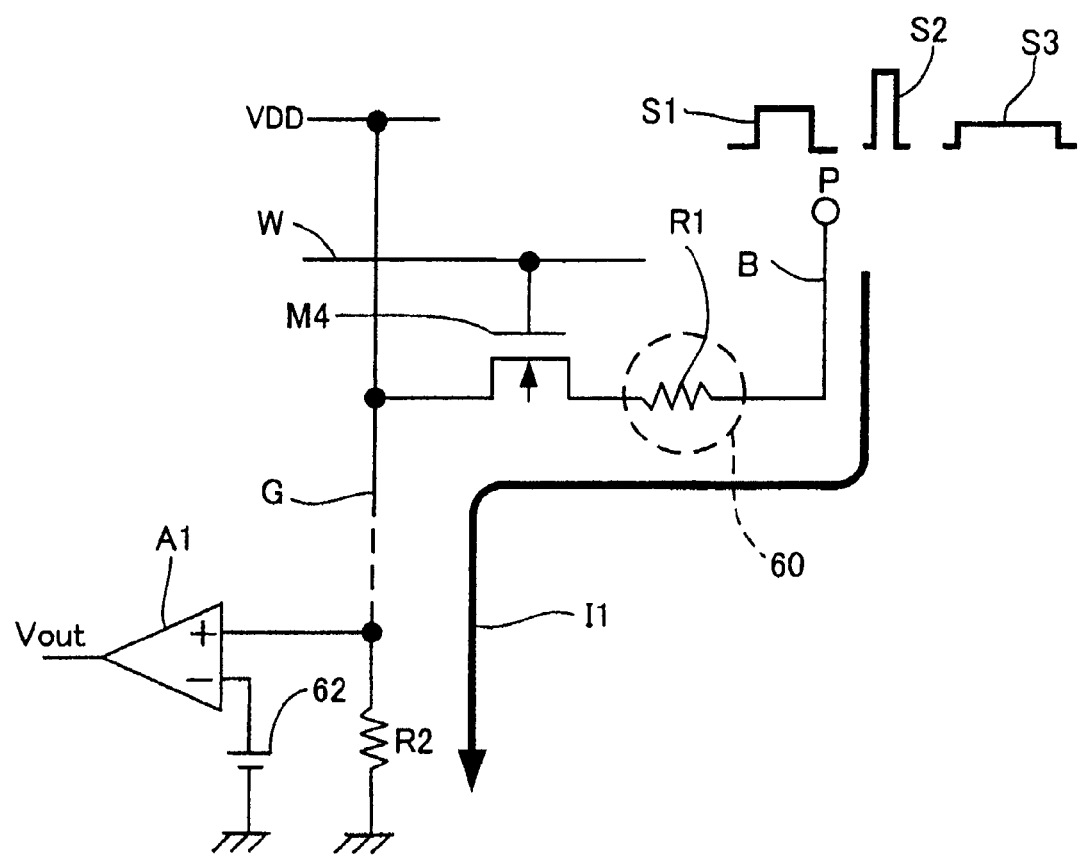
FIG. 5 is a circuit diagram showing the manner in which a phase-change memory device (phase-change memory IC) operates in the read mode.
Figure 6:
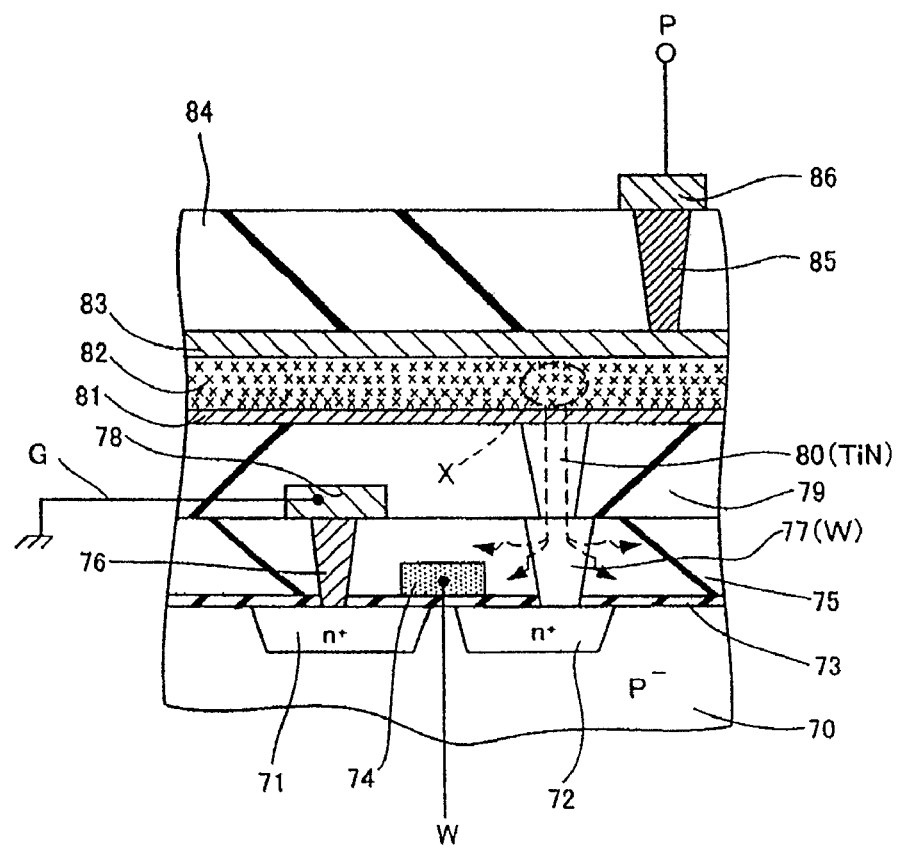
FIG. 6 is a fragmentary cross-sectional view showing specific structural details of a memory cell of a phase-change memory IC and illustrating problems thereof.

The gates of the NMOS transistors thus formed correspond to word lines DP (W1, W2) shown in FIG. 5.

Figure 13:
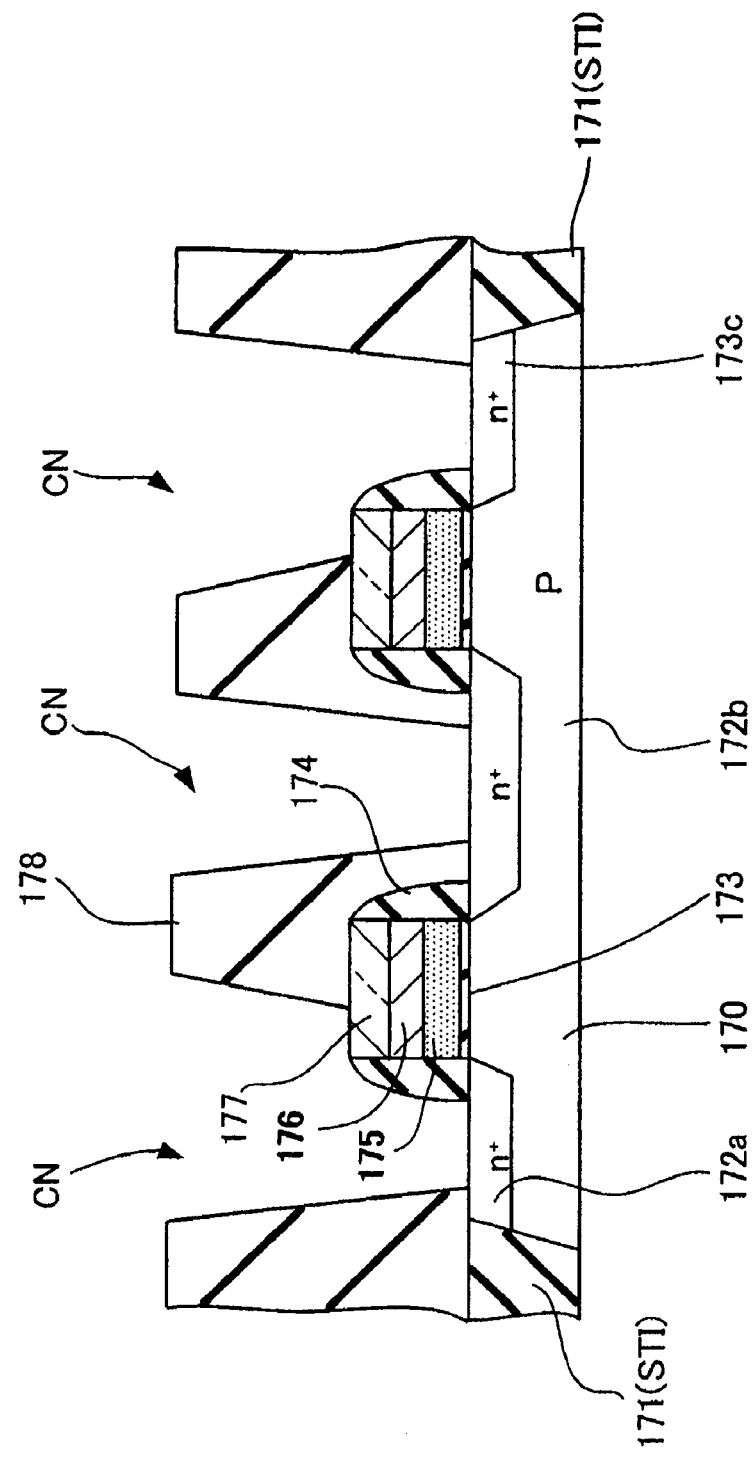
FIG. 13 is a cross-sectional view taken along line A-A of FIG. 11, showing a structure produced in a second manufacturing step.

(Second Step: FIG. 13)

FIG. 13 is a cross-sectional view taken along line A-A of FIG. 11, showing a structure produced in a second manufacturing step.

As shown in FIG. 13, TEOS oxide film 178 as an interlayer insulating film is deposited to a thickness of 700 nm, and then planarized by CMP.

Then, contact holes CN are formed at given positions in interlayer insulating film (TEOS oxide film) 178 by photolithography. When interlayer insulating film 178 is etched at this time, a silicon nitride film (not shown in FIG. 13) is used as a mask.

(Third Step: FIG. 14)

FIG. 14 is a cross-sectional view taken along line A-A of FIG. 11, showing a structure produced in a third manufacturing step.

In the third step, in order to form metal barrier 149, a Ti film and a TiN film are successively deposited to a thickness of 10 nm and a thickness of 15 nm, respectively. Then, tungsten (W) film 180 of a second electrically conductive material is deposited to a thickness of 250 nm.

Then, as shown in FIG. 8C, tungsten (W) film 180 is etched back by RIE using an $SF_6/O_2$ mixed gas until tungsten (W) film 180 has an upper surface lower than the upper surface of interlayer insulating film 178. In other words, a lower space in contact hole CN is filled with tungsten (W), thereby forming second electrically conductive material plug 180 which is made of the second electrically conductive material.

Then, as shown in FIG. 8D, titanium nitride (TiN) film 181 as a first electrically conductive material is deposited to a thickness of 50 nm on second electrically conductive material plug 180. Then, as shown in FIG. 8E, the surface formed so far is planarized by CMP down to the upper surface of interlayer insulating film 178, embedding titanium nitride film 181 in an upper space in contact hole CN thereby to form first electrically conductive material plug 181 of the first electrically conductive material.

In this manner, contact plug of different kinds of material 104 and ground potential plug 105 are formed. Then, ground interconnect 200 (G) of tungsten (W) is deposited on ground potential plug 105.

As described above, with contact plug of different kinds of material 104, two plugs (first and second plugs) 181, 180 are stacked in one contact hole CN, not that first and second plugs belonging to different layers are connected to each other. Accordingly, the number of layers is not increased, and the fabrication process is not made complex. As plugs 181, 180 are stacked one on the other, use of the contact plug of different kinds of material does not increase the area occupied by the contact plug of different kinds of material.

Figure 15:
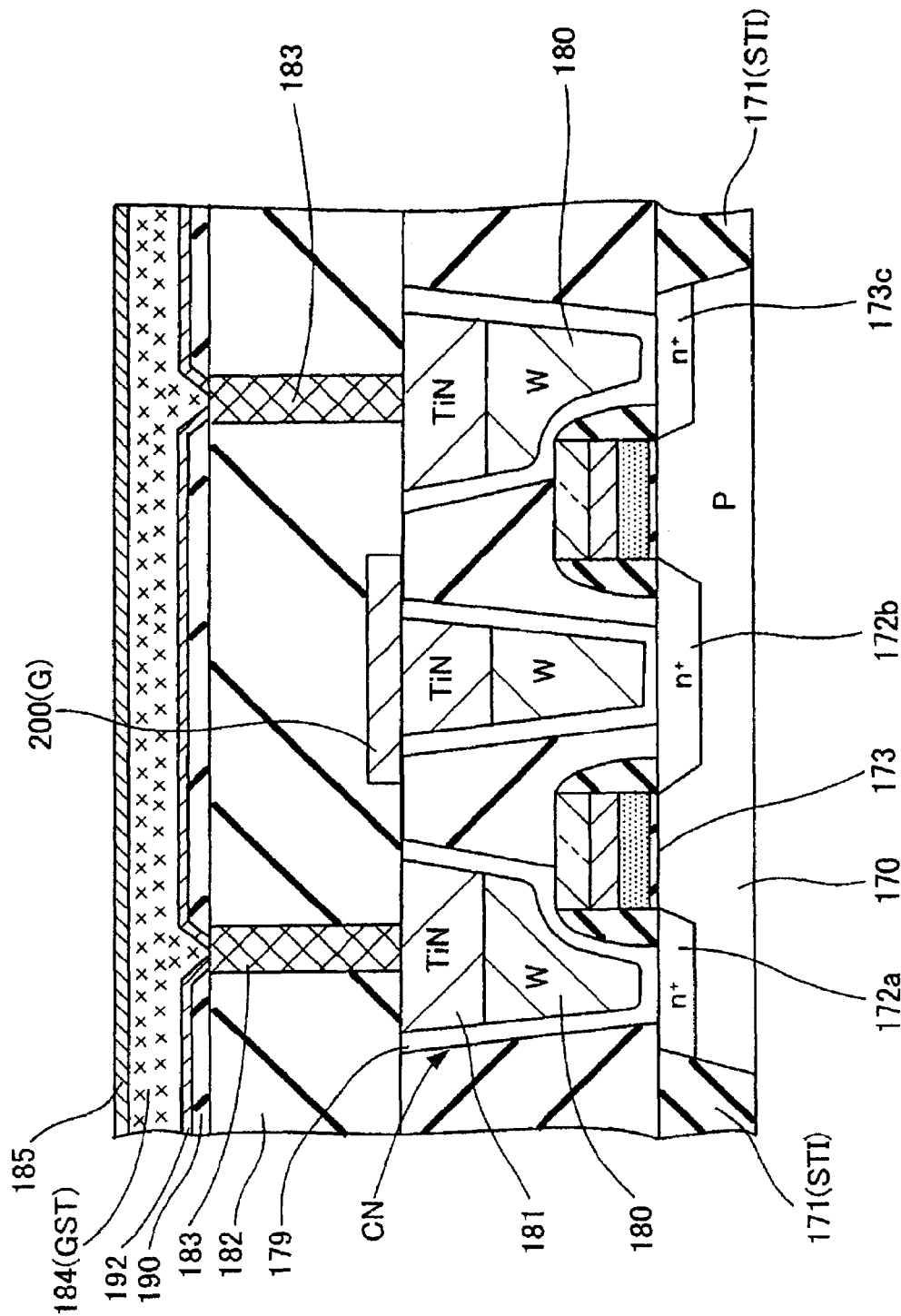
FIG. 15 is a cross-sectional view taken along line A-A of FIG. 11, showing a structure produced in a fourth manufacturing step.

(Fourth Step: FIG. 15)

FIG. 15 is a cross-sectional view taken along line A-A of FIG. 11, showing a structure produced in a fourth manufacturing step.

As shown in FIG. 15, HDP (High Density Plasma) film 182 as an interlayer insulating film is deposited on the surface formed so far, and contact holes each for embedding heater electrode 183 therein is formed in HDP film 182. TiN is buried in the contact hole, thereby forming heater electrode 183. Heater electrode 183 has a lower surface connected to the upper surface of first electrically conductive material plug (TiN) 181 of contact plug of different kinds of material 104.

Since first electrically conductive material plug 181 having high resistance is present directly below heater electrode 183, it suppresses the radiation of heat transferred through heater electrode 183. As second electrically conductive material plug 180 having low resistance is present beneath first electrically conductive material plug 181, the overall equivalent resistance (contact resistance) of the contact plug is not increased. Therefore, even though the size (W/L) of the NMOS transistor as a memory cell selecting element is not increased, a required electric current is maintained and the phase-change memory device (phase-change memory IC) is reduced in size and increased in storage capacity.

Oxide film 183 is deposited on HDP film 182 by CVD and patterned, after which thin titanium (Ti) film 190 as a contact layer is deposited. Then, GST film 184 as a phase-change layer is deposited to a thickness of 100 nm and then patterned. Upper electrode layer 185 of tungsten (W) is deposited on GST film 184.

Figure 16:
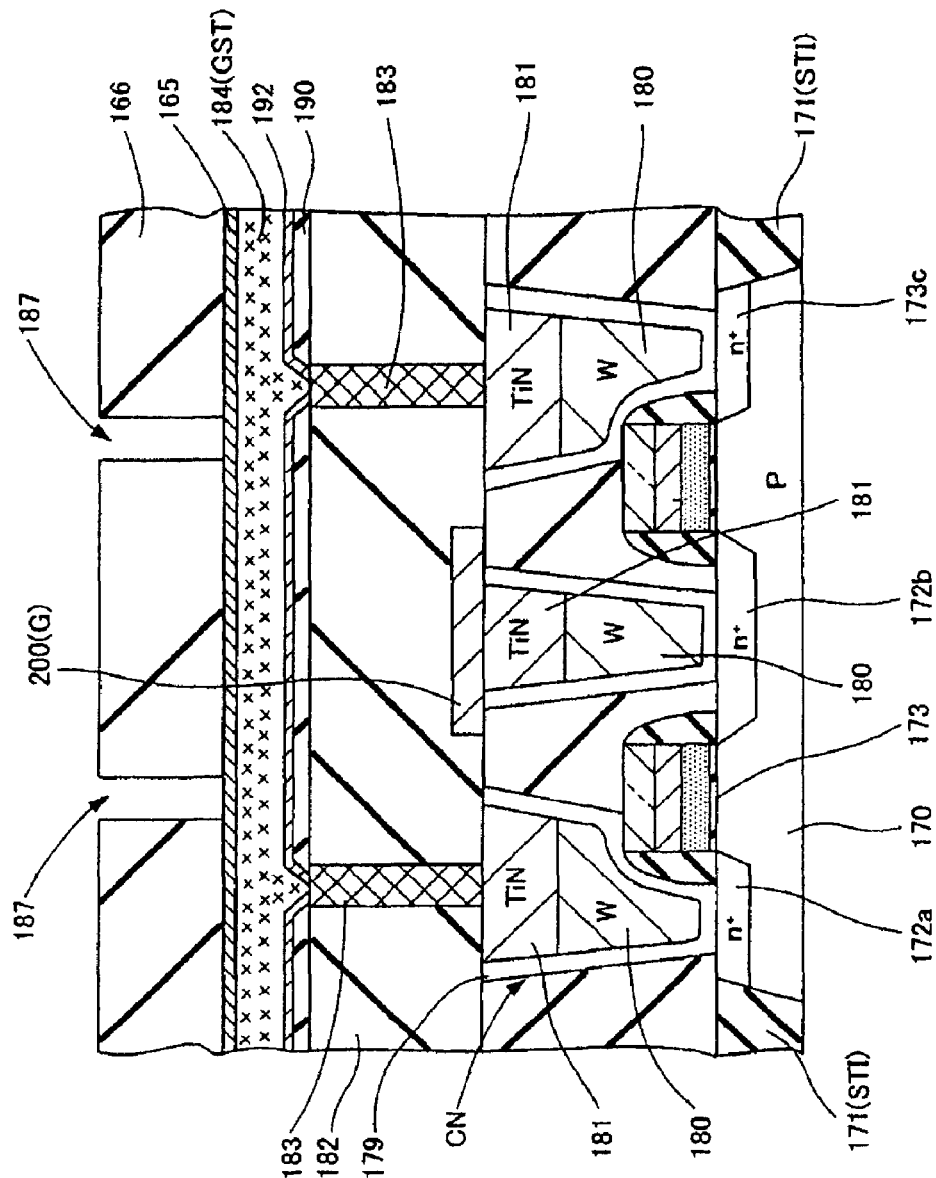
FIG. 16 is a cross-sectional view taken along line A-A of FIG. 11, showing a structure produced in a fifth manufacturing step.

(Fifth Step: FIG. 16)

FIG. 16 is a cross-sectional view taken along line A-A of FIG. 11, showing a structure produced in a fifth manufacturing step.

As shown in FIG. 16, interlayer insulating film 186 is deposited on upper layer electrode 185, and contact holes 187 are formed in interlayer insulating film 186.

Figure 17:
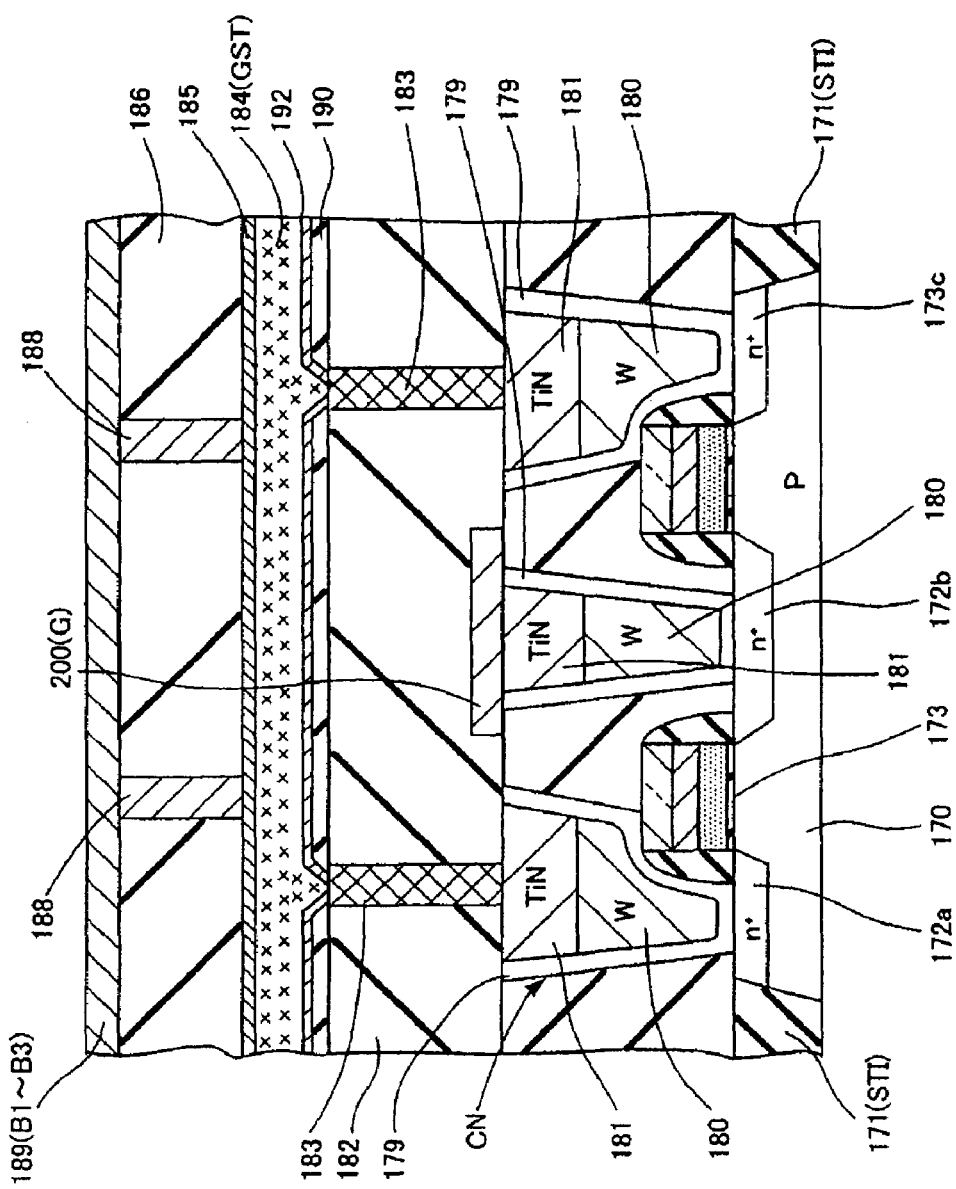
FIG. 17 is a cross-sectional view taken along line A-A of FIG. 11, showing a structure produced in a sixth manufacturing step.

(Sixth Step: FIG. 17)

FIG. 17 is a cross-sectional view taken along line A-A of FIG. 11, showing a structure produced in a sixth manufacturing step.

As shown in FIG. 17, tungsten (W) is buried in each of contact holes 187 in interlayer insulating film 186, thereby producing contact plug 188. Then, interconnect layer 189 made of tungsten (W) is deposited. Interconnect layer 189 provides bit lines B1 through B3 in the circuit arrangement shown in FIG. 10.

In this manner, a memory cell of a phase-change memory device are produced.

The preferred embodiments of the present invention has been described above. However, the present invention is not limited to the illustrated embodiments, but various changes and modifications may be made therein without departing from the scope of the present invention.

For example, MOS transistors of memory cells may be replaced with various switching elements such as bipolar transistors, junction diodes, Schottky barrier diodes, or the like.

Figure 2A:
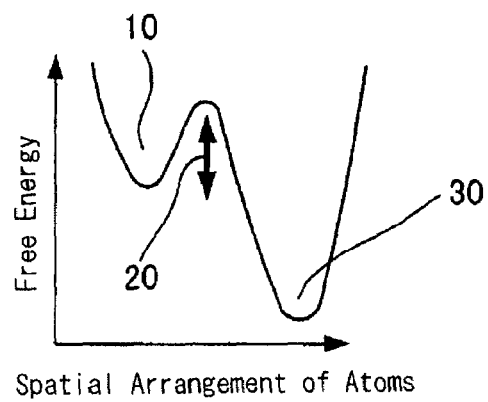
FIGS. 2A and 2B are diagrams illustrative of the principles of a phase-change memory.
Figure 2B:
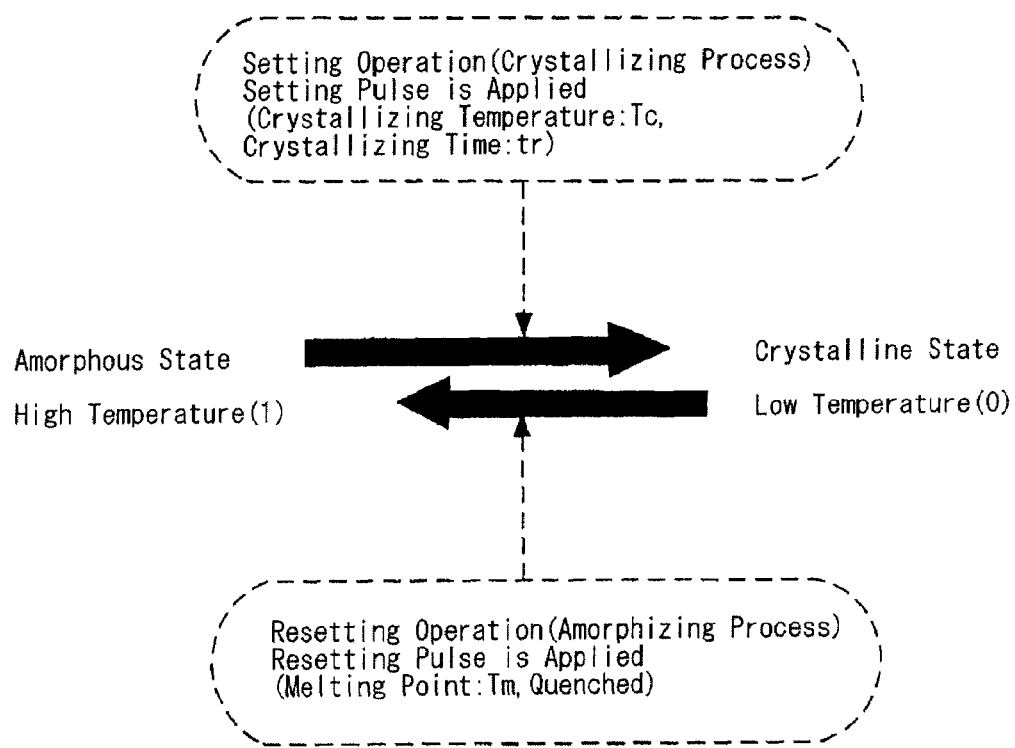
Figure 3A:
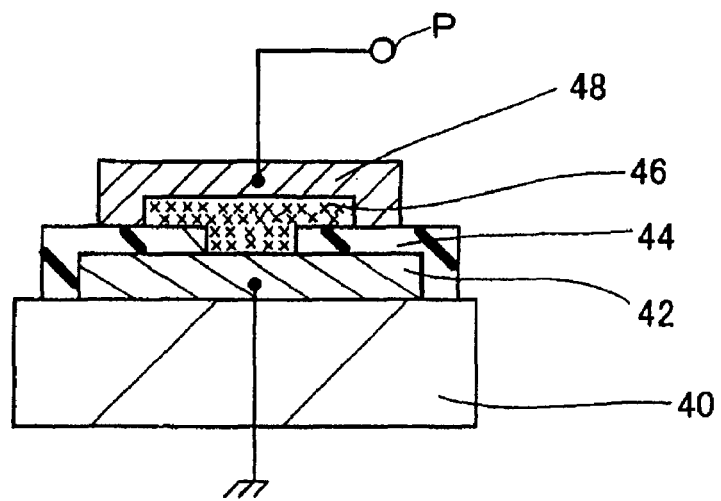
FIGS. 3A through 3D are diagrams illustrating a basic structure of a phase-change memory device and the manner in which the phase-change memory device is set and reset.
Figure 3B:
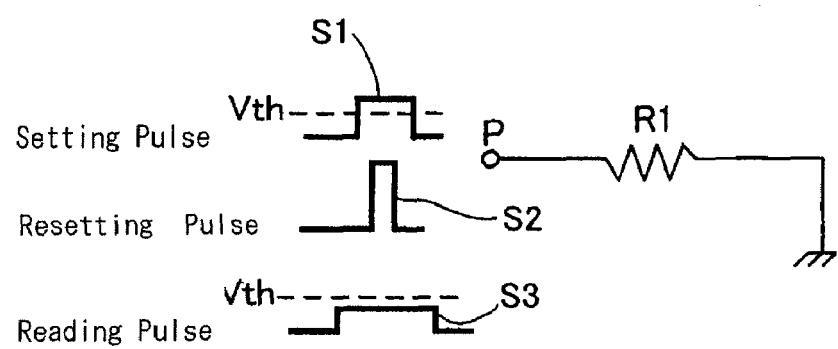
Figure 3C:
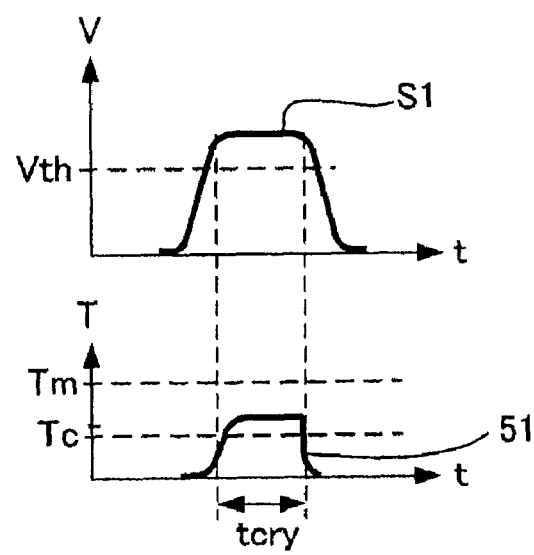
Figure 3D:
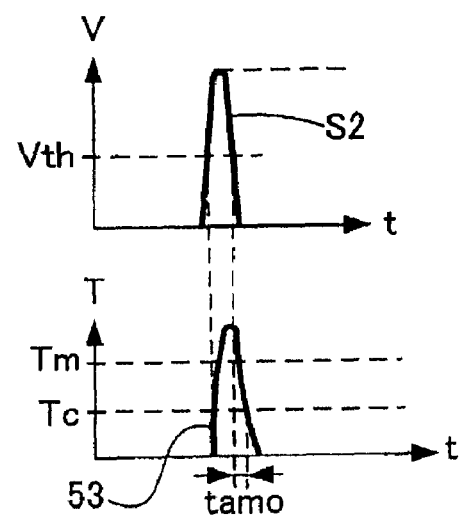
Figure 4:
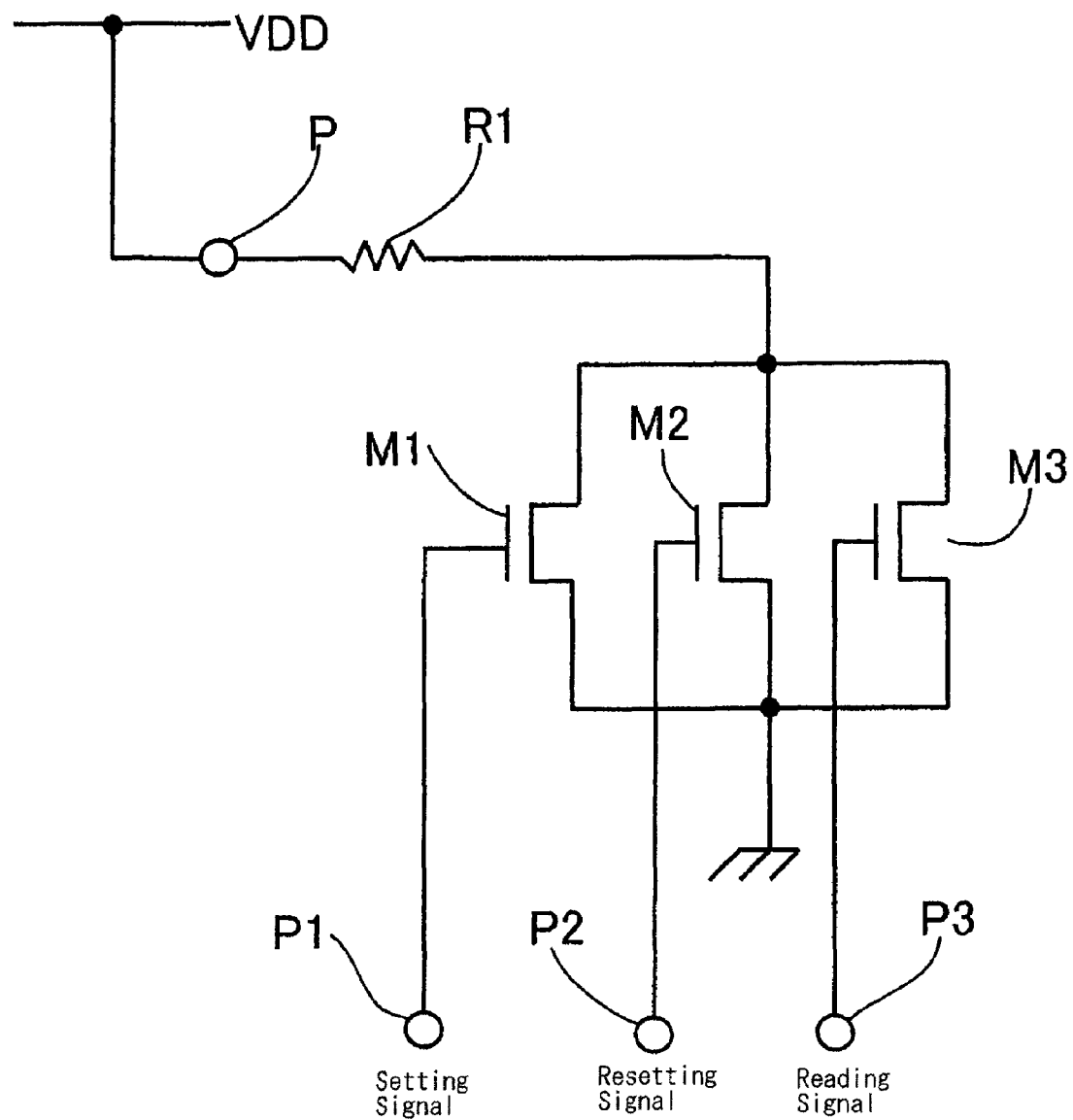
FIG. 4 is a circuit diagram of a circuit arrangement of the phase-change memory device.

The phase-change layer may be made of a material other than the chalcogenide semiconductor. The phase-change memory IC may have the circuit arrangement shown in FIG. 4 in which pulses of different waveforms are not input, but differently sized transistors are selectively turned on to pull a current.

According to the present invention, as described above, a contact plug of different kinds of material is used which comprises a first electrically conductive material plug made of a material having low thermal conductivity that is held in contact with a heater electrode, and a second electrically conductive material plug made of a material having low resistance that is connected to a switching device, an electrode, and an interconnect (electrically conductive layer). The contact plug of different kinds of material is effective to reduce the radiation of heat near the heater electrode, i.e., to improve the thermal efficiency when data is written in the phase-change memory device, in particular when the phase-change memory device is reset, and also to reduced the resistance of the electric circuit.

Specifically, since the first electrically conductive material plug having high resistance is present directly below the heater electrode, it suppresses the radiation of heat transferred through heater electrode 183. As the second electrically conductive material plug having low resistance is present beneath the first electrically conductive material plug, the overall equivalent resistance (contact resistance) of the contact plug is not increased. Therefore, even though the size (W/L) of the transistor as a memory cell selecting element is not increased, a required electric current is maintained and the phase-change memory device (phase-change memory IC) is reduced in size and increased in storage capacity.

With the contact plug of different kinds of material according to the present invention, two plugs (first and second plugs) are stacked in one contact hole, not that first and second plugs belonging to different layers are connected to each other. Accordingly, the number of layers is not increased, and the fabrication process is not made complex.

Since the plugs are stacked one on the other, the contact plug of different kinds of material does not occupy a large area, resulting in a contribution to an increase in the degree of integration of the phase-change memory device.

Inasmuch as a structure is provided to radiate the heat transmitted through the heater electrode, other electrodes and interconnects may be made of a metal material of low conductivity such as tungsten (W) or aluminum (Al) or copper (Cu) that is used in silicon-based LSI circuits. Accordingly, a greater choice of materials that can be used is available, making it possible to manufacture a large-scale phase-change memory device.

If the volume of the second electrically conductive material plug which is made of a good conductor is greater than the volume of the first electrically conductive material plug, then the electrical resistance of the contact plug of different kinds of material is governed by the second electrically conductive material plug. Therefore, the overall electrical resistance of the contact plug of different kinds of material can sufficiently be low, causing no circuit operation problems even if the length of interconnects is increased.

The first electrically conductive material plug may be made of a material which is similar or identical to the material of the heater electrode, and the second electrically conductive material plug may be made of a material which is similar or identical to the material of the ground potential interconnects and electrodes. Therefore, the present invention can be carried out without posing a large burden on the fabrication process.

It is desirable that the specific resistances of the materials of the first and second electrically conductive material plugs, i.e., the first and second electrically conductive materials, be different from each other by 10 times or more. The difference can essentially be achieved by using TiN (titanium nitride) as the first electrically conductive material and W (tungsten) as the second electrically conductive material.

According to the present invention, a contact plug of different kinds of material can be formed by embedding a second electrically conductive material in a lower space in a contact hole and thereafter embedding a first electrically conductive material in an upper space in the contact hole, using the metal material embedding technology and the etching technology.

According to the present invention, it is possible to manufacture a large-scale phase-change memory device, i.e., a phase-change memory IC having switching elements for selecting memory cells, contact plug of different kinds of materials, heater electrodes, and electrode terminals, while satisfying contradictory requirements for reduced heat radiation and reduced electric resistance using the general fabrication technology, i.e., without special fabrication processes.

The contact plug of different kinds of material and the ground potential plug can simultaneously be produced by a common fabrication process. Therefore, the number of fabrication steps can be reduced.

The upper and side surfaces of the electrically conductive material layer (doped silicon layer, etc.) of the gate electrode are covered with an electrically insulating film to prevent a short circuit between the gate electrode and the contact plug of different kinds of material.

According to the present invention, both good electric properties and good thermal properties are achieved for the phase-change memory device, using only the general-purpose semiconductor fabrication technology, but not any special technologies, and a greater choice is available of materials that can be used to make electrodes and interconnects, making it possible to manufacture a large-scale phase-change memory device.

According to the present invention, both good electric properties and good thermal properties are achieved for the phase-change memory device by using the contact plug of different kinds of material, and a greater choice is available of materials that can be used to make electrodes and interconnects, making it possible to manufacture a large-scale phase-change memory device. Therefore, the present invention is useful to provide a phase-change memory device (phase-change memory IC) using a chalcogenide phase-change film and a method of manufacturing a phase-change memory device.

What is claimed is:

1. A phase-change memory device comprising:
   a phase-change layer;
   a heater electrode having an end held in contact with said phase-change layer;
   a contact plug of different kinds of material having a first electrically conductive material plug made of a first electrically conductive material and held in contact with the other end of said heater electrode, and a second electrically conductive material plug made of a second electrically conductive material having a specific resistance smaller than said first electrically conductive material, said first electrically conductive material plug and said second electrically conductive material plug being stacked in one contact hole, said heater electrode and said second electrically conductive material plug being held in contact with each other in overlapping relation to each other; and
   an electrically conductive layer electrically connected to said second electrically conductive material plug.

2. The phase-change memory device according to claim 1, wherein said second electrically conductive material plug is greater in volume than said first electrically conductive material plug.

3. The phase-change memory device according to claim 1, wherein said first electrically conductive material of said first electrically conductive material plug includes a metal material which is a major constituent of said heater electrode, and said second electrically conductive material of said second electrically conductive material plug includes a metal material which is a major constituent of a ground potential electrode or an interconnect of said phase-change memory device.

4. The phase-change memory device according to claim 1, wherein said first electrically conductive material of said first electrically conductive material plug comprises a metal material which is the same as or similar to a metal material of said heater electrode, and said second electrically conductive material of said second electrically conductive material plug comprises a metal material which is a major constituent of a ground potential electrode or an interconnect of said phase-change memory device.

5. The phase-change memory device according to claim 1, wherein said first electrically conductive material of said first electrically conductive material plug comprises a metal which is any one of titanium (Ti), tantalum (Ta), molybdenum (Mo), niobium (Nb), zirconium (Zr) or tungsten (W), or a nitride of the metal, or a silicide of the metal.

6. The phase-change memory device according to claim 1, wherein said first electrically conductive material of said first electrically conductive material plug comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi) or molybdenum silicide (MoSi).

7. The phase-change memory device according to claim 1, wherein said second electrically conductive material of said second electrically conductive material plug comprises a metal which is any one of tungsten (W), aluminum (Al), molybdenum (Mo) or copper (Cu), or a silicide of the metal.

8. The phase-change memory device according to claim 1, wherein the specific resistance of said first electrically conductive material of said first electrically conductive material plug is at least 10 times the specific resistance of said second electrically conductive material of said second electrically conductive material plug.

9. The phase-change memory device according to claim 1, wherein said first electrically conductive material plug comprises a plug formed of a metal material including titanium nitride (TiN) embedded in an upper space in the contact hole defined in an interlayer insulating film, and said second electrically conductive material plug comprises a plug formed of a metal material including tungsten (W) embedded in a lower space in the contact hole.

10. The phase-change memory device according to claim 1, further comprising:
   a switching element for selecting a memory cell;
   said switching element having a pole electrically connected to said second electrically conductive material plug.

11. A phase-change memory device comprising:
   a switching element for selecting a memory cell, said switching element being disposed in or on a semiconductor substrate;
   a contact plug of different kinds of material having a first electrically conductive material plug and a second electrically conductive material plug which has both an electrical conductivity and a thermal conductivity greater than said first electrically conductive material plug, said first electrically conductive material plug and said second electrically conductive material plug being stacked one on the other;
   a heater electrode connected to said first electrically conductive material plug, said heater electrode and said second electrically conductive material plug being held in overlapping relation to each other;
   a phase-change layer connected to said heater electrode; and
   an electrode layer connected to said phase-change layer.

12. A method of manufacturing a contact plug of different kinds of material of a phase-change memory device according to claim 1, comprising the steps of:
   selectively patterning a portion of an interlayer insulating film disposed on a semiconductor substrate to form a contact hole therein;
   embedding said second electrically conductive material in said contact hole and etching back said second electrically conductive material until said second electrically conductive material has an upper surface lower than an upper surface of said contact hole, thereby forming said second electrically conductive material plug; and
   embedding said first electrically conductive material in said contact hole over said second electrically conductive material therein, thereby forming said first electrically conductive material plug.

13. A method of manufacturing a phase-change memory device according to claim 1, comprising the steps of:
   forming a switching element for selecting a memory cell, in or on a semiconductor substrate;
   forming said contact plug of different kinds of material such that said second electrically conductive material plug is held in electrical contact with one pole of said switching element,
   forming said heater electrode such that said heater electrode has a lower surface held in contact with an upper surface of said first electrically conductive material plug;

forming said phase-change layer such that said phase-change layer has a lower surface held in contact with an upper surface of said heater electrode; and forming an electrode layer connected to at least a portion of an upper surface of said phase-change layer.

14. The method of manufacturing a phase-change memory device according to claim 13, wherein said step of forming said contact plug of different kinds of material includes the step of forming a ground potential plug for keeping another pole of said switching element at a ground potential, when said contact plug of different kinds of material is formed.

15. The method of manufacturing a phase-change memory device according to claim 13, wherein said switching element comprises an insulated-gate field-effect transistor, and when a gate electrode of said insulated-gate field-effect transistor is formed, an electrically insulating layer is formed on upper and side surfaces of an electrically conductive material layer of said gate electrode.

16. The method of manufacturing a phase-change memory device according to claim 13, wherein the method of manufacturing a contact plug of different kinds of material comprises:

selectively patterning a portion of an interlayer insulating film disposed on a semiconductor substrate to form a contact hole therein;

embedding said second electrically conductive material in said contact hole and etching back said second electrically conductive material until said second electrically conductive material has an upper surface lower than an upper surface of said contact hole, thereby forming said second electrically conductive material plug; and embedding said first electrically conductive material in said contact hole over said second electrically conductive material therein, thereby forming said first electrically conductive material plug.

* * * * *